US011940669B2

(12) United States Patent
Wang et al.

(10) Patent No.: US 11,940,669 B2
(45) Date of Patent: Mar. 26, 2024

(54) GLASSES

(71) Applicant: SHENZHEN SHOKZ CO., LTD., Guangdong (CN)

(72) Inventors: Yueqiang Wang, Shenzhen (CN); Haofeng Zhang, Shenzhen (CN); Yongjian Li, Shenzhen (CN); Yunbin Chen, Shenzhen (CN); Fen You, Shenzhen (CN); Lei Zhang, Shenzhen (CN)

(73) Assignee: SHENZHEN SHOKZ CO., LTD., Shenzhen (CN)

( * ) Notice: Subject to any disclaimer, the term of this patent is extended or adjusted under 35 U.S.C. 154(b) by 704 days.

(21) Appl. No.: 17/099,808

(22) Filed: Nov. 17, 2020

(65) Prior Publication Data

US 2021/0072564 A1 Mar. 11, 2021

Related U.S. Application Data

(63) Continuation of application No. PCT/CN2019/102408, filed on Aug. 24, 2019.

(30) Foreign Application Priority Data

Aug. 24, 2018 (CN) .......................... 201810975515.1
Jan. 5, 2019 (CN) .......................... 201910009904.3
Jan. 5, 2019 (CN) .......................... 201920031804.6

(51) Int. Cl.
G02C 5/22 (2006.01)
G02C 5/14 (2006.01)
(Continued)

(52) U.S. Cl.
CPC ............... *G02C 11/10* (2013.01); *G02C 5/14* (2013.01); *G02C 5/22* (2013.01); *G02C 5/2254* (2013.01);
(Continued)

(58) Field of Classification Search
None
See application file for complete search history.

(56) References Cited

U.S. PATENT DOCUMENTS 4,902,120 A 2/1990 Weyer
7,289,767 B2 10/2007 Lai
(Continued)

FOREIGN PATENT DOCUMENTS

CN 2639920 Y 9/2004
CN 102141688 A 8/2011
(Continued)

OTHER PUBLICATIONS

International Search Report in PCT/CN2019/102394 dated Nov. 28, 2019, 8 pages.

(Continued)

*Primary Examiner* — Darryl J Collins
(74) *Attorney, Agent, or Firm* — METIS IP LLC

(57) ABSTRACT

The present disclosure provides glasses including: a glasses rim; a glasses temple; a rotating shaft, the rotating shaft being configured to connect the glasses rim and the glasses temple, so that the glasses rim and the glasses temple are able to relatively rotate around the rotating shaft, and the rotating shaft being disposed with a rotating shaft wiring channel along an axial direction; a connection wire, the connection wire passing through the rotating shaft wiring channel and extending to the glasses rim and the glasses temple, respectively; and a speaker, the speaker comprising an earphone core, the speaker being connected to the glasses temple, the control circuit or the battery in the glasses temple driving the earphone core to vibrate to generate a sound through the connection wire.

19 Claims, 22 Drawing Sheets

(51) Int. Cl.

| | | |
|---|---|---|
| *G02C 11/00* | (2006.01) | |
| *G02C 11/06* | (2006.01) | |
| *H04R 1/02* | (2006.01) | |
| *H04R 1/04* | (2006.01) | |
| *H04R 1/06* | (2006.01) | |
| *H04R 1/10* | (2006.01) | |
| *H04R 1/28* | (2006.01) | |
| *H04R 9/02* | (2006.01) | |
| *H04R 9/06* | (2006.01) | |
| *H04R 25/00* | (2006.01) | |
| *H05K 1/02* | (2006.01) | |
| *H05K 1/18* | (2006.01) | |

(52) U.S. Cl.
CPC ............... *G02C 11/06* (2013.01); *H04R 1/02* (2013.01); *H04R 1/028* (2013.01); *H04R 1/04* (2013.01); *H04R 1/06* (2013.01); *H04R 1/10* (2013.01); *H04R 1/1008* (2013.01); *H04R 1/1033* (2013.01); *H04R 1/1041* (2013.01); *H04R 1/1075* (2013.01); *H04R 1/1083* (2013.01); *H04R 1/28* (2013.01); *H04R 9/02* (2013.01); *H04R 9/025* (2013.01); *H04R 9/06* (2013.01); *H04R 25/65* (2013.01); *H05K 1/028* (2013.01); *H05K 1/189* (2013.01); *H04R 2460/13* (2013.01); *H05K 2201/05* (2013.01)

(56) References Cited

U.S. PATENT DOCUMENTS

| | | | | |
|---|---|---|---|---|
| 10,659,868 | B1* | 5/2020 | Xu | ............ G02B 27/0176 |
| 10,670,888 | B1* | 6/2020 | Yang | ............ G02C 11/10 |
| 2008/0013041 | A1 | 1/2008 | Chou | |
| 2008/0074609 | A1 | 3/2008 | Ifergan | |
| 2009/0290730 | A1 | 11/2009 | Fukuda et al. | |
| 2011/0064255 | A1* | 3/2011 | Lewis | ............ G02C 11/10 |
| | | | | 381/381 |
| 2011/0200204 | A1 | 8/2011 | Horigome et al. | |
| 2014/0253867 | A1 | 9/2014 | Jiang et al. | |
| 2015/0257662 | A1 | 9/2015 | Lee et al. | |
| 2016/0234613 | A1 | 8/2016 | Westerkull | |
| 2016/0246076 | A1 | 8/2016 | Wei | |
| 2017/0090201 | A1 | 3/2017 | Guo | |
| 2018/0333590 | A1* | 11/2018 | Millard | ............ A61N 5/0618 |
| 2019/0041666 | A1* | 2/2019 | Abele | ............ G02B 27/00 |
| 2020/0336824 | A1 | 10/2020 | Zheng et al. | |
| 2020/0344542 | A1 | 10/2020 | Liu et al. | |

FOREIGN PATENT DOCUMENTS

| | | |
|---|---|---|
| CN | 201984240 U | 9/2011 |
| CN | 102523546 A | 6/2012 |
| CN | 202306037 U | 7/2012 |
| CN | 202364340 U | 8/2012 |
| CN | 203786416 U | 8/2014 |
| CN | 204374548 U | 6/2015 |
| CN | 105007551 A | 10/2015 |
| CN | 204887455 U | 12/2015 |
| CN | 205103503 U | 3/2016 |
| CN | 205301727 U | 6/2016 |
| CN | 205720956 U | 11/2016 |
| CN | 205793159 U | 12/2016 |
| CN | 205793173 U | 12/2016 |
| CN | 205961389 U | 2/2017 |
| CN | 205987287 U | 2/2017 |
| CN | 206061075 U | 3/2017 |
| CN | 206292473 U | 6/2017 |
| CN | 106937221 A | 7/2017 |
| CN | 106954150 A | 7/2017 |
| CN | 106954151 A | 7/2017 |
| CN | 106954153 A | 7/2017 |
| CN | 106974645 A | 7/2017 |
| CN | 206365029 U | 7/2017 |
| CN | 106997107 A | 8/2017 |
| CN | 206387972 U | 8/2017 |
| CN | 206421112 U | 8/2017 |
| CN | 206563855 U | 10/2017 |
| CN | 206640748 U | 11/2017 |
| CN | 206920741 U | 1/2018 |
| CN | 107948881 A | 4/2018 |
| CN | 207266241 U | 4/2018 |
| CN | 207424414 U | 5/2018 |
| CN | 207443120 U | 6/2018 |
| CN | 108391188 A | 8/2018 |
| CN | 207718105 U | 8/2018 |
| CN | 207720370 U | 8/2018 |
| CN | 108600920 A | 9/2018 |
| CN | 108776393 A | 11/2018 |
| CN | 108845436 A | 11/2018 |
| CN | 108873372 A | 11/2018 |
| CN | 208079380 U | 11/2018 |
| CN | 109061902 A | 12/2018 |
| CN | 109495809 A | 3/2019 |
| CN | 208780924 U | 4/2019 |
| CN | 208780925 U | 4/2019 |
| CN | 208780926 U | 4/2019 |
| CN | 208780932 U | 4/2019 |
| CN | 208847977 U | 5/2019 |
| CN | 208847981 U | 5/2019 |
| CN | 110022516 A | 7/2019 |
| CN | 209184747 U | 7/2019 |
| CN | 209267805 U | 8/2019 |
| CN | 209358728 U | 9/2019 |
| JP | S59161928 A | 9/1984 |
| JP | 2006157318 A | 6/2006 |
| WO | 9623373 A1 | 8/1996 |
| WO | 2006023341 A2 | 3/2006 |
| WO | 2007070508 A2 | 6/2007 |
| WO | 2007133055 A1 | 11/2007 |
| WO | 2015115693 A1 | 8/2015 |

OTHER PUBLICATIONS

International Search Report in PCT/CN2019/102377 dated Dec. 3, 2019, 8 pages.
International Search Report in PCT/CN2019/102378 dated Nov. 6, 2019, & pages.
International Search Report in PCT/CN2019/102385 dated Nov. 18, 2019, 6 pages.
International Search Report in PCT/CN2019/102389 dated Nov. 28, 2019, 8 pages.
International Search Report in PCT/CN2019/102396 dated Nov. 27, 2019, 8 pages.
International Search Report in PCT/CN2019/102395 dated Nov. 27, 2019, 9 pages.
International Search Report in PCT/CN2019/102406 dated Nov. 26, 2019, 7 pages.
International Search Report in PCT/CN2019/102407 dated Nov. 8, 2019, 6 pages.
International Search Report in PCT/CN2019/102408 dated Nov. 6, 2019, 6 pages.
International Search Report in PCT/CN2019/102398 dated Oct. 31, 2019, 6 pages.
International Search Report in PCT/CN2019/102386 dated Nov. 25, 2019, 7 pages.
International Search Report in PCT/CN2019/102390 dated Nov. 22, 2019, 8 pages.
International Search Report in PCT/CN2019/102391 dated Nov. 22, 2019, 8 pages.

* cited by examiner

GLASSES

CROSS-REFERENCE TO RELATED APPLICATION

This application is a Continuation of International Application No. PCT/CN2019/102408 filed on Aug. 24, 2019, which claims priority of Chinese Patent Application No. 201810975515.1 filed on Aug. 24, 2018, Chinese Patent Application No. 201910009904.3 filed on Jan. 5, 2019, and Chinese Patent Application No. 201920031804.6 filed on Jan. 5, 2019, the contents of each of which are hereby incorporated by reference in its entirety.

TECHNICAL FIELD

The present disclosure relates to the field of glasses, and more specifically relates to glasses having a speaker.

BACKGROUND

With the development of speaker technology, electronic products (e.g., earphones, MP3, etc.) have been widely used. Speakers may have different product forms. For example, a speaker may be integrated on glasses (e.g., sunglasses, swimming glasses, etc.) or fixed inside an ear or near the ear of a user through a special structure (e.g., an ear hook). As the functions of the products become more diverse, there may be more and more internal modules and wiring of the speaker, and the wiring may be more and more complicated. The complicated wiring may greatly occupy an internal space of the product, and an unreasonable wiring distribution may cause wires to affect each other, which may cause an abnormal sound and affect the sound quality of the speaker. Therefore, it may be necessary to provide a more efficient wiring technology, so as to simplify the wiring work of the speaker and improve the sound quality of the speaker.

SUMMARY

An embodiment of the present specification may provide glasses. The glasses may include a glasses rim; a glasses temple, the glasses temple accommodating a control circuit or a battery; a rotating shaft, the rotating shaft being configured to connect the glasses rim and the glasses temple, so that the glasses rim and the glasses temple are able to relatively rotate around the rotating shaft, and the rotating shaft is disposed with a rotating shaft wiring channel along an axial direction; a connection wire, the connection wire passing through the rotating shaft wiring channel and extending to the glasses rim and the glasses temple, respectively; and a speaker, the speaker comprising an earphone core, the speaker being connected to the glasses temple, the control circuit or the battery in the glasses temple driving the earphone core to vibrate to generate a sound through the connection wire, and the speaker comprising at least one contact surface, the contact surface including a gradient structure causing an uneven distribution of pressure on the contact surface when in contact with a user.

DETAILED DESCRIPTION

Figure 1:
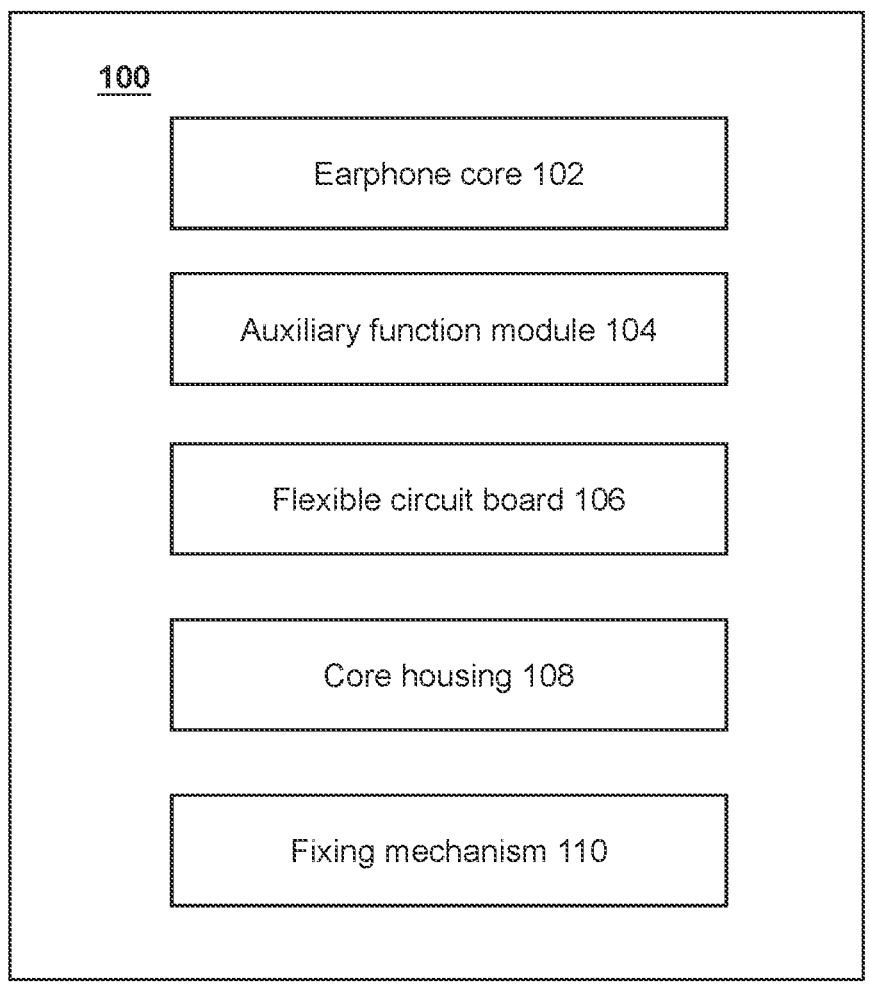
FIG. 1 is a block diagram illustrating a structure of a speaker according to some embodiments of the present disclosure.

In order to illustrate the technical solutions related to the embodiments of the present disclosure, the drawings used to describe the embodiments are briefly introduced below. Obviously, drawings described below are only some examples or embodiments of the present disclosure. Those skilled in the art, without further creative efforts, may apply the present disclosure to other similar scenarios according to these drawings. It should be understood that the purposes of these illustrated embodiments are only provided to those skilled in the art to practice the application, and not intended to limit the scope of the present disclosure. Unless obviously obtained from the context or the context illustrates otherwise, the same numeral in the drawings refers to the same structure or operation.

As used in the disclosure and the appended claims, the singular forms "a," "an," and "the" may include plural referents unless the content clearly dictates otherwise. In general, the terms "comprise" and "include" merely prompt to include steps and elements that have been clearly identified, and these steps and elements do not constitute an exclusive listing. The methods or devices may also include other steps or elements. The term "based on" is "based at least in part on." The term "one embodiment" means "at least one embodiment;" the term "another embodiment" means "at least one other embodiment." Related definitions of other terms will be given in the description below. In the following, without loss of generality, the "glasses" or "sunglasses" described in the present disclosure means "glasses" or "sunglasses" with a loudspeaker component. For those skilled in the art, "glasses" or "sunglasses" may also be replaced with other similar words, such as "eye protection device," "eye wearable device," or the like. In fact, the various implementations in the present disclosure may be easily applied to hearing devices other than the speaker. For those skilled in the art, after understanding the basic principles of glasses, it may be possible to make various modifications and changes in the form and details of the specific methods and operations of implementing glasses without departing from the principles. In particular, an environmental sound collection and processing function may be added to the glasses to enable the glasses to implement the function of a hearing aid. For example, a microphone may collect environmental sounds of a user/wearer, process the sounds using a certain algorithm and transmit the processed sound (or generated electrical signal) to a speaker of glasses. That is, the glasses may be modified to include the function of collecting the environmental sounds, and after a certain signal processing, the sound may be transmitted to the user/wearer via the speaker, thereby implementing the function of the hearing aid. As an example, the algorithm mentioned herein may include noise cancellation, automatic gain control, acoustic feedback suppression, wide dynamic range compression, active environment recognition, active noise reduction, directional processing, tinnitus processing, multi-channel wide dynamic range compression, active howling suppression, volume control, or the like, or any combination thereof.

FIG. 1 is a block diagram illustrating a structure of a speaker according to some embodiments of the present disclosure.

A speaker 100 may at least include an earphone core 102, an auxiliary unction module 104, and a flexible circuit board 106.

In some embodiments, the earphone core 102 may receive electrical audio signal(s) and convert the audio signal(s) into the sound signal(s). The flexible circuit board 106 may facilitate electrical connection(s) between different modules/components. For example, the flexible circuit board 106 may facilitate an electrical connection between the earphone core 102 and an external control circuit and an electrical connection between the earphone core 102 and the auxiliary function module 104.

In some embodiments, the earphone core 102 may at least include a magnetic circuit component, a vibration component, and a bracket that accommodates the magnetic circuit component and the vibration component. The magnetic circuit component may be used to provide a magnetic field. The vibration component may be used to convert an electrical signal input to the vibration component into a mechanical vibration signal so as to generate a sound. In some embodiments, the vibration component may include at least a coil and an inner lead. In some embodiments, the earphone core 102 may also include an external wire. The external wire may be capable of transmitting an audio current to the coil in the vibration component. One end of the external wire may be connected to the inner lead of the earphone core, and the other end may be connected to the flexible circuit board of the speaker. In some embodiments, the bracket may have a wiring groove. The external wire and/or the inner lead may be partially disposed of the wiring groove described in detail in other parts of the present disclosure.

In some embodiments, the auxiliary function module 104 may be used to receive auxiliary signal(s) and perform auxiliary function(s). The auxiliary function module 104 may be a module different from the earphone core and may be used for receiving the auxiliary signal(s) and performing the auxiliary function(s). In the present disclosure, the conversion of the audio signal into the sound signal may be considered as a main function of the speaker 100, and other functions different from the main function may be considered as the auxiliary function(s) of the speaker 100. For example, the auxiliary function(s) of the speaker 100 may include receiving a user sound and/or an ambient sound through a microphone, controlling a broadcasting process of the sound signal through a key, or the like, and a corresponding auxiliary function module may include a microphone, a key switch, etc., which may be set according to actual needs. The auxiliary signal(s) may be electric signal(s) related to the auxiliary function(s), optical signal(s) related to the auxiliary function(s), acoustic signal(s) related to the auxiliary function(s), vibration signals) related to the auxiliary function(s), or the like, or any combination thereof.

The speaker 100 may further include a core housing 108 for accommodating the earphone core 102, the auxiliary function module 104, and the flexible circuit board 106. When the speaker 100 is a bone conduction earphone, an inner wall of the core housing 108 may be directly or indirectly connected to the vibration component in the earphone core. When the user wears the bone conduction earphone, an outer wall of the core housing 108 may be in contact with the user and transmit the mechanical vibration of the vibration component to an auditory nerve through a bone, so that the human body may hear the sound. In some embodiments, the speaker may include the earphone core 102, the auxiliary function module 104, the flexible circuit board 106, and the core housing 108.

In some embodiments, the flexible circuit board 106 may be a flexible printed circuit board (FPC) accommodated in the inner space of the core housing 108. The flexible circuit board 106 may have high flexibility and be adapted to the inner space of the core housing 108. Specifically, in some embodiments, the flexible circuit board 106 may include a first board and a second board. The flexible circuit board 106 may be bent at the first board and the second board so as to adapt to a position of the flexible circuit board in the core housing 108, or the like. More details may refer to descriptions in other parts of the present disclosure.

In some embodiments, the speaker 100 may transmit the sound through a bone conduction approach. An outer surface of the core housing 108 may have a fitting surface. The fitting surface may be an outer surface of the speaker 100 in contact with the human body when the user wears the speaker 100. The speaker 100 may compress the fitting surface against a preset area (e.g., a front end of a tragus, a position of a skull, or a back surface of an auricle), thereby effectively transmitting the vibration signal(s) to the auditory nerve of the user through the bone and improving the sound quality of the speaker 100. In some embodiments, the fitting surface may be abutted on the back surface of the auricle. The mechanical vibration signal(s) may be transmitted from the earphone core to the core housing and transmitted to the back of the auricle through the fitting surface of the core housing. The vibration signal(s) may then be transmitted to the auditory nerve by the bone near the back of the auricle. In this case, the bone near the back of the auricle may be closer to the auditory nerve, which may have a better conduction effect and improve the efficiency of transmitting the sound to the auditory nerve by the speaker 100.

In some embodiments, the speaker 100 may further include a fixing mechanism 110. The fixing mechanism 110 may be externally connected to the core housing 108 and used to support and maintain the position of the core housing 108. In some embodiments, a battery assembly and a control circuit may be disposed in the fixing mechanism 110. The battery assembly may provide electric energy to any electronic component in the speaker 100. The control circuit may control any function component in the speaker 100. The function component may include, but be not limited to, the earphone core, the auxiliary function module, or the like. The control circuit may be connected to the battery and other functional components through the flexible circuit board or the wire.

In some embodiments, the fixing mechanism 110 may be a glasses rim, a hat, a headgear, other headwear accessories, or the like, or any combination thereof. For example, the fixing mechanism 110 may be a glasses rim. A cavity may be formed inside the glasses rim. The cavity may accommodate the battery assembly, the flexible circuit board, and the control circuit. In this case, the earphone core 102 may be located at the end of the glasses temple, which may be located near the ear and provide the sound signal(s) when the user wears the glasses.

Figure 2:
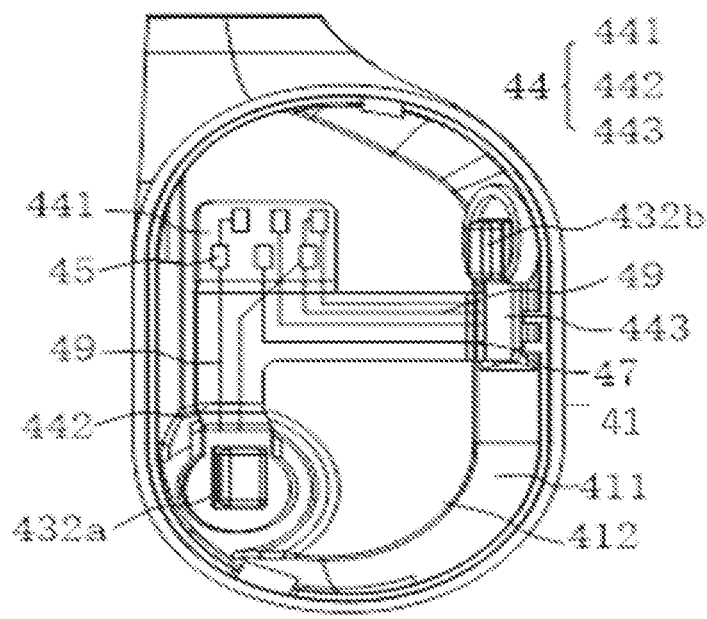
FIG. 2 is a schematic diagram illustrating a structure of a flexible circuit board according to some embodiments of the present disclosure.

FIG. 2 is a schematic diagram illustrating a structure of a flexible circuit board located inside a core housing according to some embodiments of the present disclosure.

Figure 3:
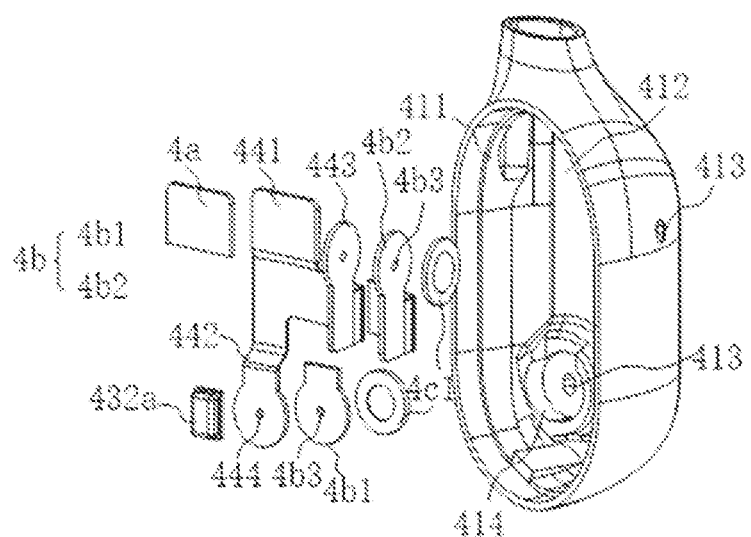
FIG. 3 is an exploded diagram illustrating a partial structure of a speaker according to some embodiments of the present disclosure.

In some embodiments, the flexible circuit board may be disposed with a number of pads. Different signal wires (e.g., audio signal wires, auxiliary signal wires) may be electrically connected to different pads through different flexible leads to avoid numerous and complicated internal wires issues, which may occur when both audio signal wires and auxiliary signal wires need to be connected to the earphone core or the auxiliary function module. As shown in FIGS. 2 and 3, a flexible circuit board 44 may at least include a number of first pads 45 and a number of second pads (not shown in the figures). In some embodiments, the flexible circuit board 44 in FIG. 2 may correspond to the flexible circuit board 106 in FIG. 1. At least one of the first pads 45 may be electrically connected to auxiliary function module(s). The at least one of the first pads 45 may be electrically connected to at least one of the second pads through a first flexible lead 47 on the flexible circuit board 44. The at least one of the second pads may be electrically connected to an earphone core (not shown in the figures) through external wire(s) (not shown in the figures). At least another one of the first pads 45 may be electrically connected to auxiliary signal wire(s). The at least another one of the first pads 45 and the auxiliary function module(s) may be electrically connected through a second flexible lead 49 on the flexible circuit board 44. In the embodiment, the at least one of the first pads 45 may be electrically connected to the auxiliary function module(s). The at least one of the second pads may be electrically connected to the earphone core through the external wire(s). The one of the at least one of the first pads 45 may be electrically connected to one of the at least one of the second pads through the first flexible lead 47, so that the external audio signal wire(s) and the auxiliary signal wire(s) may be electrically connected to the earphone core and the auxiliary function modules at the same time through the flexible circuit board, which may simplify a layout of the wiring.

In some embodiments, the audio signal wire(s) may be wire(s) electrically connected to the earphone core and transmitting audio signal(s) to the earphone core. The auxiliary signal wire(s) may be wire(s) electrically connected to the auxiliary function modules and performing signal transmission with the auxiliary function modules.

In some embodiments, referring to FIG. 2, specifically, the flexible circuit board 44 may be disposed with the number of pads 45 and two pads (not shown in the figure). The two pads and the number of pads 45 may be located on the same side of the flexible circuit board 44 and spaced apart. The two pads may be connected to two corresponding pads 45 of the number of pads 45 through the flexible lead(s) 47 on the flexible circuit board 44. Further, a core housing 41 may also accommodate two external wires. One end of each of the external wires may be welded to the corresponding pad, and the other end may be connected to the earphone core, so that the earphone core may be connected to the pads through the external wires. The auxiliary function modules may be mounted on the flexible circuit board 44 and connected to other pads of the number of pads 45 through the flexible lead(s) 49 on the flexible circuit board 44.

In some embodiments, wires may be disposed in the fixing mechanism 110 of the speaker 100. The wires may at least include the audio signal wire(s) and the auxiliary signal wire(s). In some embodiments, there may be multiple wires in the fixing mechanism 110. Such wires may include at least two audio signal wires and at least two auxiliary signal wires. For example, the fixing mechanism 110 may be a glasses rim. The glasses rim may be connected to the core housing 41, and the wires may be wires disposed in the glasses rim. One end of the plurality of the wires in the glasses rim may be welded to the flexible circuit board 44 or a control circuit board disposed in the core housing 108, and the other end of the plurality of the wire may enter the core housing 41 and be welded to the pad 45 on the flexible circuit board 44.

As used herein, one end of each of the two audio signal wires of the plurality of wires in the glasses rim, which may be located in the core housing 41, may be welded to the two pads 45 by two flexible leads 47, and the other end may be directly or indirectly connected to the control circuit board. The two pads 45 may be further connected to the earphone core through the welding of the flexible lead(s) 49 and the two pads 46 in FIG. 4 and the welding of the two external wires and the pads, thereby transmitting the audio signal(s) to the earphone core.

One end of each of at least two auxiliary signal wires in the core housing 41 may be welded to the pad 45 by the flexible lead(s) 49, and the other end may be directly or indirectly connected to the control circuit board so as to transmit the auxiliary signal(s) received and transformed by the auxiliary function module(s) to the control circuit (not shown in the figure).

In the approach described above, the flexible circuit board 44 may be disposed in the core housing 41, and the corresponding pads may be further disposed on the flexible circuit board 44. Therefore, the wires (not shown in the figure) may enter the core housing 41 and be welded to the corresponding pads, and further connected to the corresponding auxiliary function module(s) through the flexible leads 47 and the flexible leads 49 on the pads, thereby avoiding a number of wires directly connected to the auxiliary function module(s) to make the wiring in the core housing 41 complicated. Therefore, the arrangement of the wirings may be optimized, and the space occupied by the core housing 41 may be saved. In addition, when a number of the wires in the glasses rim are directly connected to the auxiliary function module(s), a middle portion of the wires in the glasses rim may be suspended in the core housing 41 to easily cause vibration, thereby resulting in abnormal sounds to affect the sound quality of the earphone core. According to the approach, the wires in the glasses rim may be welded to the flexible circuit board 44 and further connected to the corresponding auxiliary function module(s), which may reduce a situation that the wires are suspended from affecting the quality of the earphone core, thereby improving the sound quality of the earphone core to a certain extent.

In some embodiments, the flexible circuit board (also referred to as the flexible circuit board 44) may be further divided. The flexible circuit board may be divided into at least two regions. One auxiliary function module may be disposed on one of the at least two regions, so that at least two auxiliary function modules may be disposed on the flexible circuit board. Wiring between the audio signal wire(s) and the auxiliary signal wire(s) and the at least two auxiliary function modules may be implemented through the flexible circuit board. In some embodiments, the flexible circuit board may at least include a main circuit board and a first branch circuit board. The first branch circuit board may be connected to the main circuit board and extend away from the main circuit board along one end of the main circuit board. The auxiliary function module(s) may include at least a first auxiliary function module and a second auxiliary function module. The first auxiliary function module may be disposed on the main circuit board, and the second auxiliary function module may be disposed on the first branch circuit board. The number of first pads may be disposed on the main circuit board, and the second pads may be disposed on the first branch circuit board. In some embodiments, the first auxiliary function module may be a key switch. The key switch may be disposed on the main circuit board, and the first pads may be disposed corresponding to the key switch. The second auxiliary function module may be a microphone. The microphone may be disposed on the first branch circuit board, and the second pads corresponding to the microphone may be disposed on the first branch circuit board. The first pads corresponding to the key switch on the main circuit board may be connected to the second pads corresponding to the microphone on the first branch circuit board through the second flexible lead(s). The key switch may be electrically connected to the microphone, so that the key switch may control or operate the microphone.

In some embodiments, the flexible circuit board may further include a second branch circuit board. The second branch circuit board may be connected to the main circuit board. The second branch circuit board may extend away from the main circuit board along the other end of the main circuit board and be spaced from the first branch circuit board. The auxiliary function module(s) may further include a third auxiliary function module. The third auxiliary function module may be disposed on the second branch circuit board. The number of first pads may be disposed on the main circuit board. At least one of the second pads may be disposed on the first branch circuit board, and the other second pads may be disposed on the second branch circuit. In some embodiments, the third auxiliary function module may be a second microphone. The second branch circuit board may extend perpendicular to the main circuit board. The second microphone may be mounted on the end of the second branch circuit board away from the main circuit board. The number of pads may be disposed at the end of the main circuit board away from the second branch circuit board.

Specifically, as shown in FIG. 2 and FIG. 3, the second auxiliary function module may be the first microphone 432a. The third auxiliary function module may be the second microphone 432b. As used herein, the first microphone 432a and the second microphone 432b may both be MEMS (micro-electromechanical system) microphone, which may have a small working current, relatively stable performance, and high voice quality. The two microphones 432 may be disposed at different positions of the flexible circuit board 44 according to actual needs.

As used herein, the flexible circuit board 44 may include a main circuit board 441 (or referred to the main circuit board), and a branch circuit board 442 (or referred to the first branch circuit board) and a branch circuit board 443 (or referred to the second branch circuit board) connected to the main circuit board 441. The branch circuit board 442 may extend in the same direction as the main circuit board 441. The first microphone 432a may be mounted on one end of the branch circuit board 442 away from the main circuit board 441. The branch circuit board 443 may extend perpendicular to the main circuit board 441. The second microphone 432b may be mounted on one end of the branch circuit board 443 away from the main circuit board 441. A number of pads 45 may be disposed on the end of the main circuit board 441 away from the branch circuit board 442 and the branch circuit board 443.

In one embodiment, the core housing 41 may include a peripheral side wall 411 and a bottom end wall 412 connected to one end surface of the peripheral side wall 411, so as to form an accommodation space with an open end. As used herein, an earphone core may be disposed in the accommodation space through the open end. The first microphone 432*a* may be fixed on the bottom end wall 412. The second microphone 432*b* may be fixed on the peripheral side wall 411.

In the embodiment, the branch circuit board 442 and/or the branch circuit board 443 may be appropriately bent to suit a position of a sound inlet corresponding to the microphone 432 on the core housing 41. Specifically, the flexible circuit board 44 may be disposed in the core housing 41 in a manner that the main circuit board 441 is parallel to the bottom end wall 412. Therefore, the first microphone 432*a* may correspond to the bottom end wall 412 without bending the main circuit board 441. Since the second microphone 432*b* may be fixed on the peripheral side wall 411 of the core housing 41, it may be necessary to bend the second main circuit board 441. Specifically, the branch circuit board 443 may be bent at one end away from the main circuit board 441 so that a board surface of the branch circuit board 443 may be perpendicular to a board surface of the main circuit board 441 and the branch circuit board 442. Further, the second microphone 432*b* may be fixed at the peripheral side wall 411 of the core housing 41 in a direction facing away from the main circuit board 441 and the branch circuit board 442.

In one embodiment, the first pads 45, the second pads, the first microphone 432*a*, and the second microphone 432*b* may be disposed on the same side of the flexible circuit board 44. The second pads may be disposed adjacent to the second microphone 432*b*.

As used herein, the second pads may be specifically disposed at one end of the branch circuit board 443 away from the main circuit board 441 and have the same direction as the second microphone 432*b* and disposed at intervals. Therefore, the second pads may be perpendicular to the direction of the first pads 45 as the branch circuit board 443 is bent. It should be noted that the branch circuit board 443 may not be perpendicular to the board surface of the main circuit board 441 after being bent, which may be determined according to the arrangement between the peripheral side wall 411 and the bottom end wall 412.

Further, another side of the flexible circuit board 44 may be disposed with a rigid support plate 4*a* and a microphone rigid support plate 4*b* for supporting the first pads 45. The microphone rigid support plate 4*b* may include a rigid support plate 4*b*1 for supporting the first microphone 432*a* and a rigid support plate 4*b*2 for supporting the second pads and the second microphone 432*b* together.

As used herein, the rigid support plate 4*a*, the rigid support plate 4*b*1, and the rigid support plate 4*b*2 may be mainly used to support the corresponding pads and the microphone 432, and thus may need to have certain strengths. The materials of the three may be the same or different. The specific material may be polyimide film (PI film), or other materials that may provide the strengths, such as polycarbonate, polyvinyl chloride, etc. In addition, the thicknesses of the three rigid support plates may be set according to the strengths of the rigid support plates, and actual strengths required by the first pads 45, the second pads, the first microphone 432*a*, and the second microphone 432*b*, and be not specifically limited herein.

As used herein, the rigid support plate 4*a*, the rigid support plate 4*b*1, and the rigid support plate 4*b*2 may be three different regions of an entire rigid support plate, or three independent bodies spaced apart from each other, and be not specifically limited herein.

In one embodiment, the first microphone 432*a* and the second microphone 432*b* may correspond to two microphone components 4*c*, respectively (not shown in the figure). In one embodiment, the structures of the two microphone components may be the same. A sound inlet 413 may be disposed on the core housing 41. Further, the bond conduction loudspeaking device may be further disposed with an annular blocking wall 414 integrally formed on the inner surface of the core housing 41 at the core housing 41, and disposed at the periphery of the sound inlet 413, thereby defining an accommodation space (not shown in the figure) connected to the sound inlet 413.

In one embodiment, the flexible circuit board 44 may be disposed between a rigid support plate (e.g., the rigid support plate 4*a*, the rigid support plate 4*b*1, and the rigid support plate 4*b*2) and the microphone 432. A sound input 444 may be disposed at a position corresponding to a sound input 4*b*3 of the microphone rigid support plate 4*b*.

Further, the flexible circuit board 44 may further extend away from the microphone 432, so as to be connected to other functional components or wires to implement corresponding functions. Correspondingly, the microphone rigid support plate 4*b* may also extend out a distance with the flexible circuit board in a direction away from the microphone 432.

Correspondingly, the annular blocking wall 414 may be disposed with a gap matching the shape of the flexible circuit board to allow the flexible circuit board to extend out of the accommodation space 415. In addition, the gap may be further filled with a sealant to further improve the sealing.

Figure 4:
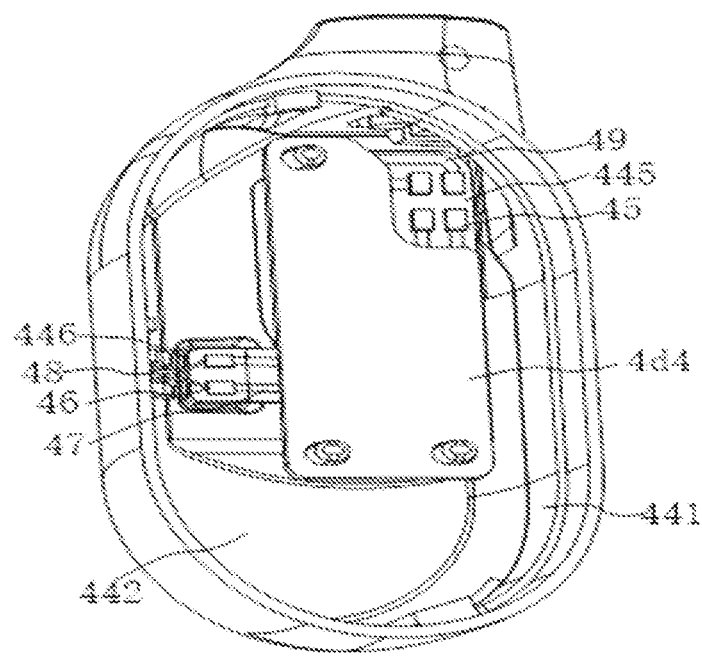
FIG. 4 is a sectional view illustrating a partial structure of a speaker according to some embodiments of the present disclosure.

FIG. 4 is a partial sectional view illustrating a structure of a speaker according to some embodiments of the present disclosure. In some embodiments, as shown in FIG. 4, the flexible circuit board 44 may include a main circuit board 445 and a branch circuit board 446. The branch circuit board 446 may extend along an extending direction perpendicular to the main circuit board 445. As used herein, the number of first pads 45 may be disposed at the end of the main circuit board 445 away from the branch circuit board 446. A key switch may be mounted on the main circuit board 445. The second pads 46 may be disposed at the end of the branch circuit boards 446 away from the main circuit board 445. The first auxiliary function module may be a key switch. The second auxiliary function module may be a microphone.

In the embodiment, a board surface of the flexible circuit board 44 and the bottom end wall 412 may be disposed in parallel and at intervals, so that the key switch may be disposed towards the bottom end wall 412 of the core housing 41.

As described above, an earphone core (or the earphone core 102) may include a magnetic circuit component, a vibration component, an external wire, and a bracket. As used herein, the vibration component may include a coil and an inner lead. The external wire may transmit an audio current to the coil in the vibration component. One end of the external wire may be connected to the inner lead of the earphone core, and the other end may be connected to the flexible circuit board of a speaker. The bracket may have a wiring groove. At least a portion of the external wire and/or the inner lead may be disposed in the wiring groove. In some embodiments, the inner lead and the outer wire may be welded to each other. A welding position may be located in the wiring groove.

Figure 5:
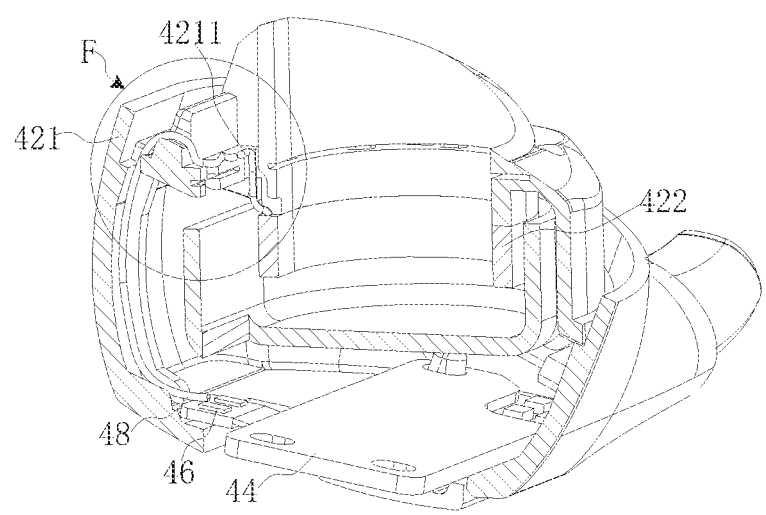
FIG. 5 is a partial sectional diagram illustrating a speaker according to some embodiments of the present disclosure.
Figure 6:
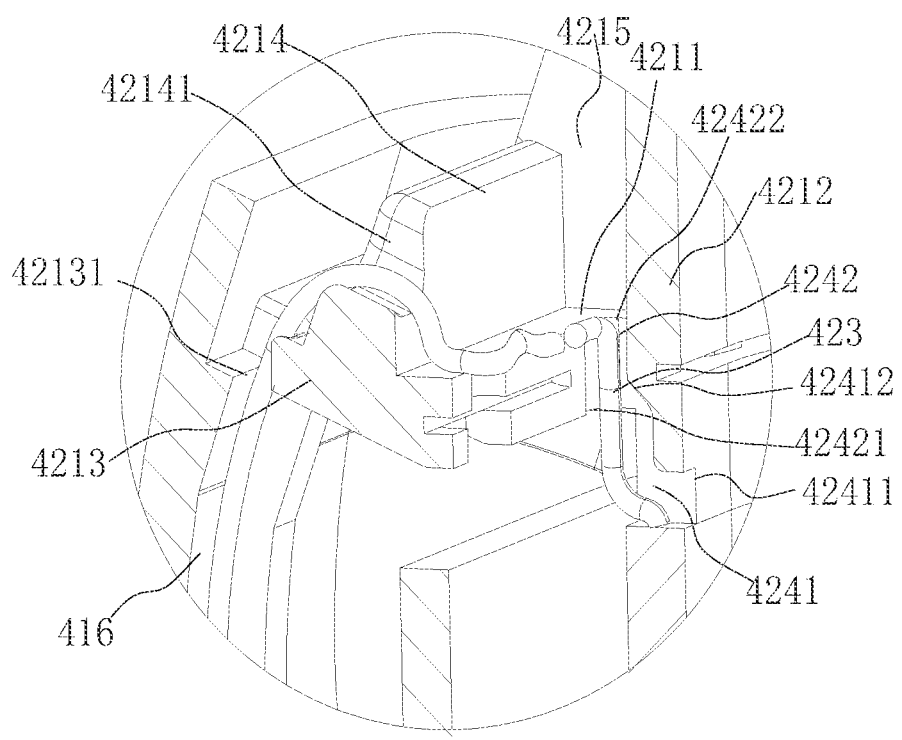
FIG. 6 is a partial enlarged diagram illustrating part F of a speaker in FIG. 5 according to some embodiments of the present disclosure.

FIG. 5 is a partial sectional diagram illustrating a speaker according to some embodiments of the present disclosure. FIG. 6 is a partial enlarged diagram illustrating part F of a speaker in FIG. 5 according to some embodiments of the present disclosure. Specifically, referring to FIG. 5 and FIG. 6, an earphone core may include a bracket 421, a coil 422, and an external wire 48. The bracket 421 may be used to support and protect the entire structure of the earphone core. In the embodiment, the bracket 421 may be disposed with a wiring groove 4211 used to accommodate a circuit of the earphone core.

The coil 422 may be disposed on the bracket 421 and have at least one inner lead 423. One end of the inner lead(s) 423 may be connected to a main circuit in the coil 422 to lead out the main circuit and transmit an audio current to the coil 422 through the inner lead 423.

One end of the external wire 48 may be connected to the inner lead(s) 423. Further, the other end of the external wire 48 may be connected to a control circuit (not shown in the figure) to transmit the audio current through the control circuit to the coil 422 through the inner lead 423.

Specifically, during an assembly stage, the external wire 48 and the inner lead(s) 423 may need to be connected together by means of welding, or the like. Due to structural and other factors, after the welding is completed, a length of the wire may not be exactly the same as a length of a channel, and there may be an excess length part of the wire. And if the excess length part of the wire is not disposed reasonably, it may vibrate with the vibration of the coil 422, thereby making an abnormal sound and affecting the sound quality of the earphone core.

Further, at least one of the external wire 48 and the inner lead 423 may be wound and disposed in the wiring groove 4211. In an application scenario, the welding position between the inner lead 423 and the external wire 48 may be disposed in the wiring groove 4211, so that a portion of the external wire 48 and the inner lead 423 located near the welding position may be wound in the wiring groove 4211. In addition, in order to maintain stability, the wiring groove 4211 may be further filled with a sealant to further fix the wiring in the wiring groove 4211.

In the manner described above, the wiring groove 4211 may be disposed on the bracket 421, so that at least one of the external wire 48 and the inner lead 423 may be wound into the wiring groove 4211 to accommodate the excess length part of the wire, thereby reducing the vibration generated inside the channel, and reducing the influence of the abnormal sound caused by the vibration on the sound quality of the earphone core.

In one embodiment, the bracket 421 may include an annular main body 4212, a support flange 4213, and an outer blocking wall 4214. As used herein, the annular main body 4212, the support flange 4213, and the outer blocking wall 4214 may be integrally formed.

As used herein, the annular main body 4212 may be disposed inside the entire bracket 421 and used to support the coil 422. Specifically, a cross-section of the annular main body 4212 in a direction perpendicular to the radial direction of a ring of the annular main body 4212 may be consistent with the coil 422. The coil 422 may be disposed at an end of the annular main body 4212 facing the core housing. The inner side wall and the outer side wall of the annular main body 4212 may be flush with the inner side wall and the outer side wall of the coil 422, respectively, so that the inner side wall of the coil 422 and the inner side wall of the annular main body 4212 may be coplanar, and the outer side wall of the coil 422 and the outer side wall of the annular main body 4212 may be coplanar.

Further, the support flange 4213 may protrude on the outer side wall of the annular main body 4212 and extend along the outside of the annular main body 4212. Specifically, the support flange 4213 may extend outward in a direction perpendicular to the outer side wall of the annular main body 4212. As used herein, the support flange 4213 may be disposed at a position between two ends of the annular main body 4212. In the embodiment, the support flange 4213 may protrude around the outer side wall of the annular main body 4212 to form an annular support flange 4213. In other embodiments, the support flange 4213 may also be formed by protruding at a portion of the outer side wall of the annular main body 4212 according to needs.

The outer blocking wall 4214 may be connected to the support flange 4213 and spaced apart from the annular main body 4212 along the side of the annular main body 4212. As used herein, the outer blocking wall 4214 may be sleeved on the periphery of the annular main body 4212 and/or the coil 422 at intervals. Specifically, the outer blocking wall 4214 may be partially sleeved around the periphery of the annular main body 4212 and the coil 422 according to actual needs, or partially sleeved around the periphery of the annular main body 4212. It should be noted that, in the embodiment, a portion of the outer blocking wall 4214 close to the wiring groove 4211 may be sleeved on a portion of the periphery of the annular main body 4212. Specifically, the outer blocking wall 4214 may be disposed on a side of the support flange 4213 away from the core housing. As used herein, the outer side wall of the annular main body 4212, the side wall of the support flange 4213 away from the core housing, and the inner side wall of the outer blocking wall 4214 may together define the wiring groove 4211.

In one embodiment, a wiring channel 424 may be disposed on the annular main body 4212 and the support flange 4213. The inner lead(s) 423 may extend inside the wiring groove 4211 via the wiring channel 424.

As used herein, the wiring channel 424 may include a sub-wiring channel 4241 on the annular main body 4212 and a sub-wiring channel 4242 on the support flange 4213. The sub-wiring channel 4241 may be disposed through the inner side wall and the outer side wall of the annular main body 4212. A wiring port 42411 communicating with one end of the sub-wiring channel 4241 may be disposed on a side of the annular main body 4212 near the coil 422. A wiring port 42412 communicating with the other end of the sub-wiring channel 4241 may be disposed on a side of the core housing near the support flange 4213 facing the core housing. The sub-wiring channel 4242 may penetrate the support flange 4213 in a direction towards the outside of the core housing. The wiring port 42421 communicating with the end of the sub-wiring channel 4242 may be disposed on a side of the support flange 4213 facing the core housing. The wiring port 42422 communicating with the other end of the sub-wiring channel 4242 may be disposed on a side away from the core housing. As used herein, the wiring port 42412 and the wiring port 42421 may communicate through a space between the support flange 4213 and the annular main body 4212.

Further, the inner lead(s) 423 may enter the wiring port 42411, extend along the sub-wiring channel 4241, exit from the wiring port 42412 to enter a region between the annular main body 4212 and the support flange 4213, further enter the sub-wiring channel 4242 from the wiring port 42421, and extend into the wiring groove 4211 after passing through the wiring port 42422.

In one embodiment, the top of the outer blocking wall 4214 may be disposed with a slot 42141. The external wire 48 may extend inside the wiring groove 4211 through the slot 42141.

As used herein, one end of the external wire 48 may be disposed on the flexible circuit board 44. The flexible circuit board 44 may be specifically disposed on an inner side of the earphone core facing the core housing.

In the embodiment, the support flange 4213 may be further extended to a side of the outer blocking wall 4214 away from the annular main body 4212 to form an outer edge. Further, the outer edge may surround and abut on the inner side wall of the core housing. Specifically, the outer edge of the support flange 4213 may be disposed with a slot 42131, so that the external wire 48 on the inner side of the earphone core facing the core housing may be extended to the outer side of the support flange 4213 facing the core housing through the slot 42131, and then to the slot 42141, and enter the wiring groove 4211 through the slot 42141.

Further, the inner side wall of the core housing may be disposed with a guide groove 416. One end of the guide groove 416 may be located on one side of the flexible circuit board 44 and the other end may communicate with the slot 42131 and extend in a direction towards the outside of the core housing, so that the external wire 48 extends from the flexible circuit board to a second wiring groove 3331 by passing through the guide groove 416.

In one embodiment, the bracket 421 may further include two side blocking walls 4215 spaced along the circumferential direction of the annular main body 4212 and connected to the annular main body 4212, the supporting flange 4213, and the outer blocking wall 4214, thereby defining the wiring groove 4211 between the two side blocking walls 4215.

Specifically, the two side blocking walls 4215 may be oppositely disposed on the support flange 4213 and protrude towards the outer side of the core housing along the support flange 4213. As used herein, a side of the two side blocking walls 4215 facing the annular main body 4212 may be connected to the outer side wall of the annular main body 4212. A side away from the annular main body 4212 may terminate at the outer side wall of the outer blocking wall 4214. The wiring port 42422 and the slot 42141 may be defined between the two side blocking walls 4215. Therefore, the inner lead(s) 423 exiting from the wiring port 42422 and the external wire 48 entering through the slot 42141 may extend into the wiring groove 4211 defined by the two side blocking walls 4215.

Figure 7:
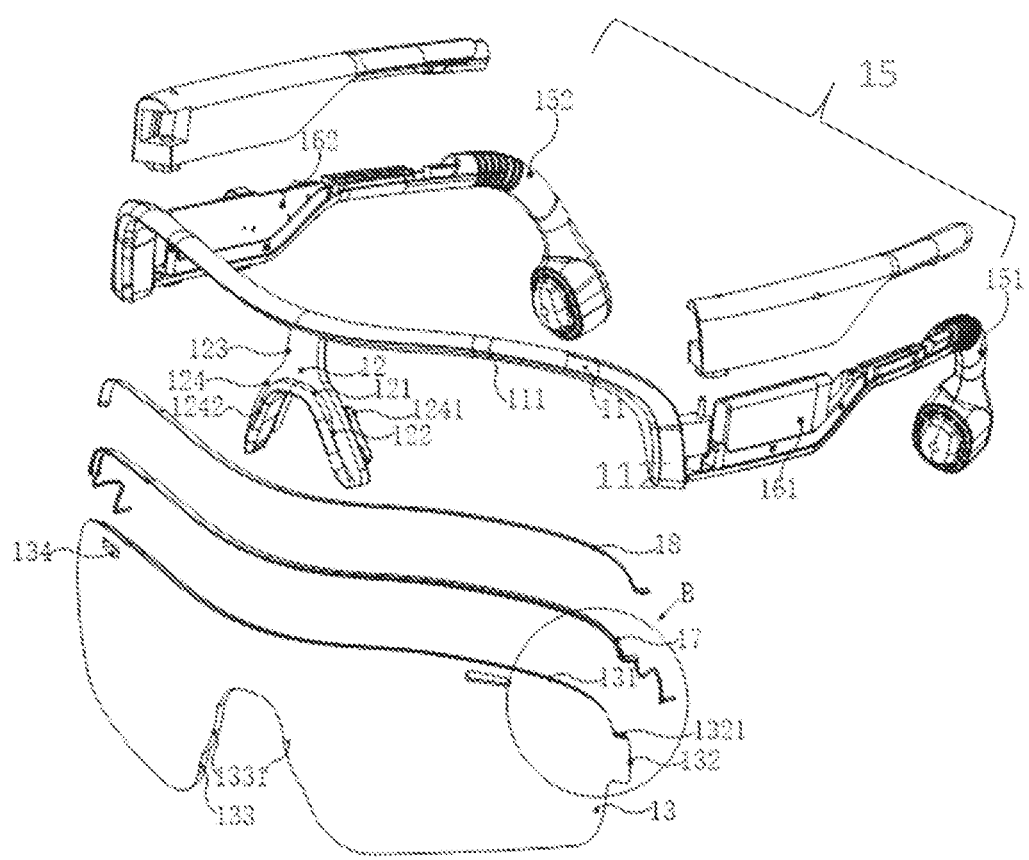
FIG. 7 is an exploded view illustrating a speaker according to some embodiments of the present disclosure.

FIG. 7 is a schematic diagram illustrating a structure of a speaker according to some embodiments of the present disclosure.

In some embodiments, the speaker may be glasses. In some embodiments, a fixing mechanism may be a glasses frame. The fixing mechanism may have at least one rotating shaft. The rotating shaft(s) may be used to connect a glasses rim and a glasses temple. The glasses rim and the glasses temple may rotate around the rotating shaft. The rotating shaft may have a rotating shaft wiring channel disposed along an axis. A connection wire may be disposed in the fixing mechanism. The connection wire may be an electrical connection wire. The connection wire may pass through the rotating shaft wiring channel. Two ends of the connection wire may extend into the glasses rim and the glasses temple, respectively. In some embodiments, the glasses temple at two sides may accommodate a control circuit and a battery component, respectively. The connection wire in the glasses rim may be electrically connect to the control circuit and the battery component. The connection wire may include an audio signal wire and an auxiliary signal wire. The connection wire may be electrically connected to a flexible circuit board (i.e., the flexible circuit board 106) in a core housing (i.e., the core housing 108), and electrically connected to an earphone core (i.e., the earphone core 102) and auxiliary function module(s) (i.e., an auxiliary function module 104) through the flexible circuit board.

In some embodiments, the glasses of the present disclosure may be glasses worn in people's daily life and at work to correct vision and protect eyes, or certain circuit structures and electronic components may be added into the glasses in order to further implement specific functions through the circuit structures and electronic components. Specifically, the glasses in the present disclosure may be smart glasses, virtual reality glasses, holographic glasses, augmented reality glasses, or glasses with other functional structures (e.g., glasses with a bone conduction earphone or an air conduction earphone).

In some embodiments, as shown in FIG. 7, the glass frame may include a glasses rim 11, a nose pad 12, a glasses lens 13, and a glasses temple 15.

As used herein, the glasses rim 11 may be used to carry at least a portion of the glasses lens 13. The nose pad 12 may be used to support the glasses on the bridge of the nose of a user when the user wears the glasses.

The nose pad 12 may be disposed in the middle of the glasses rim 11 and integrally formed with the glasses rim 11. In the prior art, the glasses rim 11 and the nose pad 12 may be usually formed, respectively. The middle portion of the glasses rim 11 may be disposed with a structure connected to the nose pad 12. After molding, the nose pad 12 may be installed on the connection structure of the glasses rim 11. In the embodiment, the glasses rim 11 and the nose pad 12 may be integrally formed directly. Specifically, a corresponding mold may be used to implement the integral molding, for example, injection molding, or the like. In the embodiment, the glasses rim 11 and the nose pad 12 may not need to be further installed after the molding, thereby simplifying a manufacturing process of glasses.

In addition, the glasses lens 13 may also be integrally designed, and be fixed by the glasses rim 11 and the nose pad 12 in a clamping manner.

Further, the glasses rim 11 and the nose pad 12 may be respectively disposed with a structure for clamping the glasses lens 13. When the glasses are assembled, the integrally designed glasses lens 13 may be directly clamped to the integrally formed glasses rim 11 and nose pad 12 through the corresponding clamping structures.

In the embodiment, the glasses rim 11 and the nose pad 12 may be integrally formed, and the glasses lens 13 may also be integrally designed. Therefore, the entire structure of the glasses may be simple, and the manufacturing process of the glasses may be simplified.

Referring to FIG. 7, FIG. 7 is an exploded view illustrating the glasses according to an embodiment of the present disclosure. In the embodiment, the glasses lens 13 may include a top-side edge 131 and two outer edges 132 connected to both ends of the top-side edge 131 and disposed away from the nose pad 12. Each of the outer edges 132 may be respectively disposed with a first buckle 1321. The glasses rim 11 may be disposed with a first mounting groove 111 for receiving the top-side edge 131 and at least a portion of the outer edges 132, and a first buckle groove 112 for receiving the first buckle 1321 and communicating with the first mounting groove 111.

As used herein, when the glasses are in a wearing state, the top-side edge 131 may be located on the upper side of the glasses lens 13, the outer edge may be located on both sides of the glasses lens 13 near ears of the user, and the top-side edge 131 and the two outer edges 132 may be connected to each other. The first mounting groove 111 may be disposed on a side of the glasses rim 11 facing the glasses lens 13. A size of the first mounting groove 111 may match the top-side edge 131 and the two outer edges 132 of the corresponding glasses lens 13, so that the glasses lens 13 may be mounted on the glasses rim 11 by mounting the top-side edge 131 and at least the portion of the outer edge 132 in the first mounting groove 111.

Further, the first buckle 1321 may be formed by further extending at least a portion of the outer edge 131 of the glasses lens 13 toward two sides away from the nose pad 12. The first buckle groove 112 may be formed by recessing a position of the first mounting groove 111 corresponding to the first buckling 1321 in a direction away from the glasses lens 13. As used herein, the shape and size of the first buckle groove 112 may match the first buckle 1321, so that the glasses lens 13 may be further installed on the glasses rim 11 by clamping the first buckle 1321 into the first buckle groove 112.

It should be noted that at least a portion of the outer edge 132 may be located on the side of the first buckle 1321 away from the top-side edge 131, so that the first buckle 1321 and a portion of the glasses lens 13 near the two sides of the edge of the glasses lens 13 may be accommodated inside the first mounting groove 111. Therefore, the glasses lens 13 may be more firmly fixed on the glasses rim 11.

In one embodiment, the glasses lens 13 may further include an inner edge 133 abutting on the nose pad 12. The nose pad 12 may be disposed with a second mounting groove 121 for receiving the inner edge 133.

It should be noted that the glasses lens 13 may include a left glasses lens and a right glasses lens. The inner edge 133 of the glasses lens 13 may be disposed at a connection between the left glasses lens and the right glasses lens and a vicinity of the connection. Accordingly, the second mounting groove 121 and the first mounting groove 111 may be oppositely disposed so that the opposite sides of the glasses lens 13 may be respectively received and fixed in an accommodation space formed by the glasses rim 11 and the nose pad 12.

In one embodiment, two sides of the inner edge 133 may be respectively disposed with a second buckle 1331. The nose pad 12 may be further disposed with a second buckle groove 122 connected to the second mounting groove 121 and used to receive the second buckle 1331.

As used herein, the inner edge 133 may include two portions connected to each other, which may be respectively disposed on a side of the left glass lens facing the right glass lens and a side of the right glass lens facing the left glass lens. The nose pad 12 may also be divided into two portions, which may be respectively supported on the left and right nose bridges of the user when worn by the user. Accordingly, in the embodiment, the count of the second buckle groove 122 and the second buckle 1331 may also be two. The shape and size of the second buckle 1331 may match the corresponding second buckle groove 122 to install the second buckle 1331 in the corresponding second buckle groove 122.

In addition, the glasses lens 13 may be disposed with the inner edge 133 near both sides of the second buckle 1331, which may allow the vicinity of both sides of the second buckle 1331 to be installed in the second mounting groove 121. Therefore, the glasses lens 13 may be more firmly fixed on the nose pad 12.

By the approach, the glasses lens 13 may be respectively mounted on the glasses rim 11 and the nose pad 12 through the top-side edge 131, the outer edge 132, the inner edge 133, the first buckle 1321 and the second buckle 1331.

In an application scenario, the glasses lens 13 may be further disposed with vent holes 134. Specifically, the count of the vent holes may be two, and respectively disposed on the left and right sides of the glasses lenses 13 near the top-side edge 131. The arrangement of the vent holes 134 may facilitate air circulation of the inner and outer sides of the glasses lens 13 when the user wears the glasses, thereby reducing a phenomenon of fogging of the glasses lens 13 caused by local overheating due to reasons such as user movement, etc.

Figure 8:
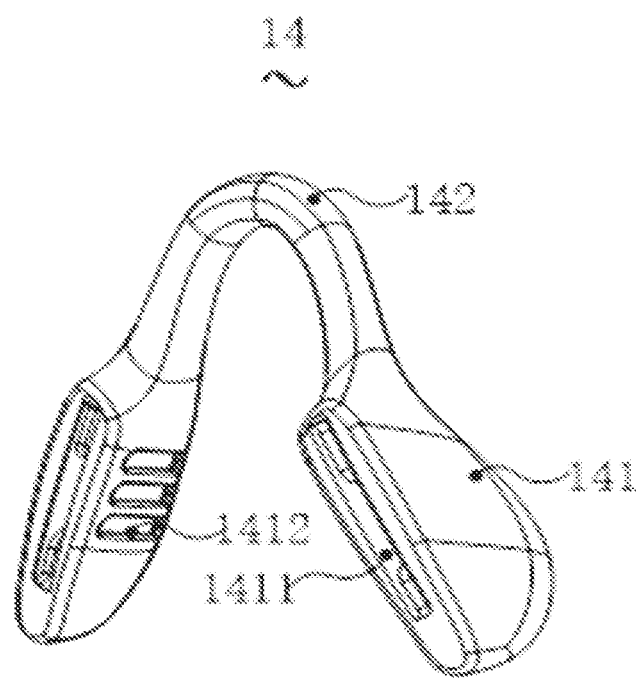
FIG. 8 is a structural diagram illustrating a nose pad cover in a speaker according to some embodiments of the present disclosure.

Specifically, referring to FIG. 7 and FIG. 8 together, FIG. 7 is an exploded view illustrating a speaker according to some embodiments of the present disclosure, and FIG. 8 is a schematic diagram illustrating a structure of a nose pad cover of glasses according to some embodiments of the present disclosure. In one embodiment, the nose pad 12 may include a connection portion 123 connected to the glasses rim 11 on the side of the first mounting groove 111 near the user or away from the user in the wearing state, and two support portions 124 connected to the connection portion 123 in an inverted Y-shaped manner on a side of the connection portion 123 away from the glasses rim 11. The support portions 124 may be used to support the glasses on the nose of the user when wearing.

In an application scenario, the connecting portion 123 may be integrally connected to the glasses rim 11. When the user wears the glasses, the connecting portion 123 may be disposed on a side of the first mounting groove 111 close to the user.

A side of each of the support portions 124 protruding toward the nose bridge of the user may be disposed with I-shaped hook(s) 1241. The glasses may further include nose pad cover(s) 14 detachably sleeved on the hook(s) 1241.

As used herein, the nose pad cover 14 may be made of soft rubber. Specifically, the count of the I-shaped hook(s) 1241 may be two, corresponding to the left and right nose bridges of the user, respectively. The nose pad cover 14 may include two cover bodies 141 and a connecting portion 142 connecting to the two cover bodies 141. As used herein, the connecting portion 142 may be connected with the nose bridge of the user. The cover bodies 141 may be correspondingly disposed with I-shaped accommodation groove(s) 1411 matching the hook(s) 1241. Sides of the cover bodies 141 facing the nose bridge of the user may further be disposed with an anti-slippery portion 1412 including a number of grooves. In the embodiment, the nose pad cover 14 may be detachably disposed, thereby facilitating cleaning and replacement of the nose pad cover 14.

Further, in an embodiment, sides of the two support portions 124 back from the hook(s) 1241 may be protruded with strip shaped ribs 1242. The strip shaped ribs 1242 may cooperate with the two support portions 124 to form the second mounting groove 121 and the second buckle groove 122.

As used herein, the strip shaped ribs 1242 may be protruded along edges of the two support portions 124 away from the glasses lens 13, thereby forming the second mounting groove 121 for receiving the inner edge 133 of the glasses lens 13. At a position corresponding to the second buckle 1331 of the glasses lens 13, the strip shaped ribs 1242 may be further recessed to form the second buckle groove 122.

Referring to FIG. 7 together, in one embodiment, the glasses rim may further include the glasses temple 15, function component(s) 16, and a connection wire 17. As used herein, the glasses temple 15 may include a first glasses temple 151 and a second glasses temple 152. The function component(s) 16 may include a first function component 161 and a second function component 162.

Specifically, the first glasses temple 151 and the second glasses temple 152 may be respectively connected to the glasses rim 11. The first function component 161 and the second function component 162 may be respectively disposed on the first glasses temple 151 and the second glasses temple 152. At least one cavity may be disposed on the two glasses temples 15 to accommodate the corresponding function components 16.

The connection wire 17 may be disposed inside the first mounting groove 111 and between the bottom of the first mounting groove 111 and the top-side edge 131 of the glasses lens 13, and further extend to the first glasses temple 151 and the second glasses temple 152 to be electrically connected to the first function component 161 and the second function component 162.

In the embodiment, the function component(s) 16 respectively disposed in the two glasses temples 15 may need to be electrically connected through the connection wire 17 so that the glasses may implement a specific function. Specifically, in an application scenario, the first function component 161 may be a battery component, and the second function component 162 may be a control circuit component. The control circuit component may be connected to the battery component through the connection wire 17, so that the battery component may provide power to the control circuit component. Therefore, the control circuit component may implement the specific function.

In order to meet requirements of beauty and lightness of the glasses, the connection wire 17 may be disposed in the first mounting groove 111 along the top-side edge 131 of the glasses lens 13 and accommodated inside a space formed by the first mounting groove 111 and the top-side edge 131 of the glasses lens 13, so that the connection wire 17 may be neither exposed on the outer surface of the glasses nor occupy extra space. In an application scenario, the connection wire 17 may further extend along the outer edge 132 of the glasses lens 13 inside the first mounting groove 111.

Specifically, the glasses rim 11, the first glasses temple 151, and the second glasses temple 152 may be respectively disposed with a wiring channel communicated with each other, so that the connection wire 17 may enter the first glasses temple 151 and the second glasses temple 152 from the first mounting groove 111 of the glasses rim 11 through the corresponding wiring channels, thereby connecting the first function component 161 and the second function component 162.

In the embodiment, the connection wire 17 may have an electrical connection function. In other embodiments, the connection wire 17 may also have a mechanical connection function.

In the embodiment, the first function component 161 and the second function component 162 may be respectively disposed on the first glasses temple 151 and the second glasses temple 152. The connection wire 17 electrically connecting the first function component 161 and the second function component 162 may be disposed inside the first mounting groove 111 on the glasses rim 11 to receive the top-side edge 131 of the glasses lens 13, so that the connection wire 17 may be disposed between the bottom of the first mounting groove 111 and the top-side edge 131 of the glasses lens, and further extend to the first glasses temple 151 and the second glasses temple 152. Therefore, the connection wire 17 may not be exposed, and extra space may not need for the arrangement of the connection wire 17, so that the beauty and lightness of the glasses may be maintained.

Figure 9:
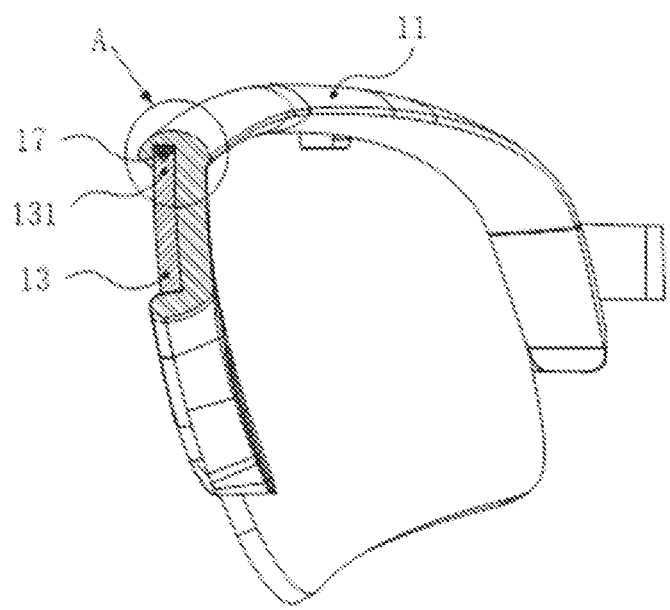
FIG. 9 is a partial sectional view illustrating a glasses rim and a glasses lens in a speaker according to some embodiments of the present disclosure.
Figure 10:
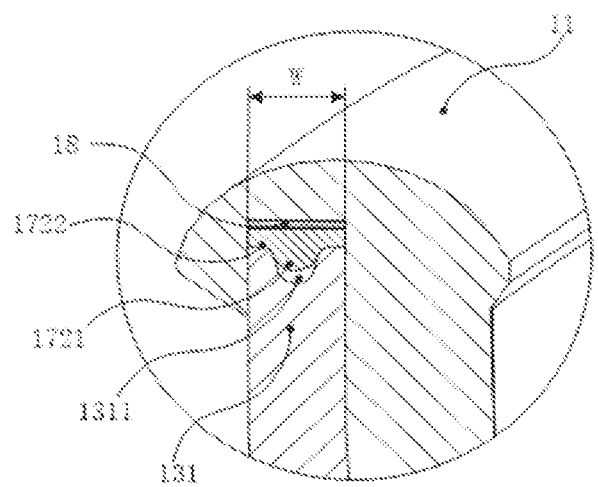
FIG. 10 is an enlarged view illustrating part A of a speaker in FIG. 9 according to some embodiments of the present disclosure.
Figure 11:
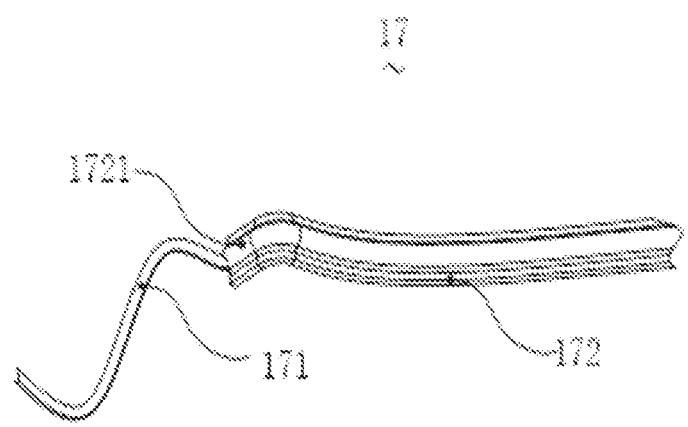
FIG. 11 is a partial structural diagram illustrating a connection wire in a speaker according to some embodiments of the present disclosure.

Referring to FIG. 9, FIG. 10, and FIG. 11 together, FIG. 9 is a partial sectional view illustrating a glasses rim and a glasses lens according to an embodiment of the present disclosure, FIG. 10 is an enlarged view illustrating part A in FIG. 9, and FIG. 11 is a partial structural diagram illustrating a connection wire according to an embodiment of the present disclosure. In the embodiment, the connection wire 17 may include a wire body 171 and a wire protection cover 172 wrapped around the periphery of the wire body 171. A sectional shape of the wire protection cover 172 may match a sectional shape of the first mounting groove 111, so that the wire protection cover 172 may be held in the first mounting groove 111 in a surface contact manner.

As used herein, the wire protection cover 172 may be made of soft rubber, so that the connection wire 17 may be bent to match the shape of the first mounting groove 111. It may be easy to understand that the wire body 171 may be thin. If the wire body 171 is directly installed in the first mounting groove 111, a contact area with the bottom of the first mounting groove 111 may be small, and it is difficult to be firmly fixed therein. In the embodiment, the wire protection cover 172 may be further wrapped around the periphery of the wire body 171, which, on the one hand, may play a role of protecting the wire body 171, and, on the other hand, increase the contact area between the connection wire 17 and the first mounting groove 111 by adjusting the surface area of the wire protection cover 172 to reliably fix the wire body 171 inside the first mounting groove 111.

Further, the sectional shape of the first mounting groove 111 may be a shape to allow the wire protection cover 172 to be held in the first mounting groove 111 with a large area of surface contact. For example, the shape may be U-shaped, rectangular, or wavy, and be not specifically limited herein. Correspondingly, the shape of a side of the wire protection cover 172 facing the bottom of the first mounting groove 111 may correspond to the shape, so that the wire protection cover 172 may be directly or indirectly fitted to the bottom of the first mounting groove 111.

In an application scenario, further referring to FIG. 7, an adhesive layer 18 may be disposed between the wire protection cover 172 and the glasses rim 11, so that the wire protection cover 172 may be fixed in the first mounting groove 111 through the adhesive layer 18.

As used herein, the adhesive layer 18 may be disposed on the bottom of the first mounting groove 111, or further extended to both sides and disposed on a side wall near the bottom of the first mounting groove 111, thereby making the adhesive layer 18 to wrap around the wire protection cover 172 to more firmly fix the connection wire 17 inside the first mounting groove 111.

Specifically, in the application scenario, a section of the first mounting groove 111 may be rectangular. The bottom of the first mounting groove 111 and a side of the wire protection cover 172 facing the bottom of the first mounting groove 111 may be both flat, and the adhesive layer 18 may be a double-sided adhesive layer disposed therebetween.

Further, in one embodiment, a side of the wire protection cover 172 facing the top-side edge 131 of the glass lens 13 may be disposed with a protruding portion 1721 corresponding to the wire body 171. The top-side edge 131 of the glasses lens 13 may be disposed with a clearance slot 1311 for receiving the protruding portion 1721.

Specifically, the section of the wire body 171 may be circular. The wire protection cover 172 may be flush with the wire body 171 on the side of the wire body 171 facing the bottom of the first mounting groove 111. The side of the wire body 171 facing away from the bottom of the first mounting groove 111 may still present the shape of the wire body 171, thereby forming the corresponding protruding portion 1721.

Further, the top-side edge 131 of the glasses lens 13 may need to be further disposed inside the first mounting groove 111. In the embodiment, the top-side edge 131 may be further disposed with the clearance slot 1311 for receiving the protruding portion 1721, so that the connection wire 17 installed inside the first mounting groove 111 may be at least partially accommodated in the clearance slot 1311 corresponding to the top-side edge 131.

Further, the protruding portion 1721 may be located in a middle region of the wire protection cover 172 along a width direction of the wire protection cover 172 to form abutting portions 1722 on two sides of the protruding portion 1721. The two abutting portions 1722 may abut on the top-side edges 131 on two sides of the clearance slot 1311, respectively. As used herein, the width direction of the wire protection cover 172 may refer to a direction perpendicular to a direction of the wire protection cover 172 along the first mounting groove 111, specifically a direction indicated by W in FIG. 10.

It may be easy to understand that the depth of the first mounting groove 111 may be limited. If the top-side edge 131 of the glasses lens 13 is flush with the protruding portion 1721 of the connection wire 17, or a side of the wire protection cover 172 and the wire body 171 facing away from the bottom of the first mounting groove 111 is flush with the wire body 171, an insertion depth of the top-side edge 131 of the glasses lens 13 in the first mounting groove 111 may be reduced, which may disadvantage the stable installation of the glasses lens 13 in the glasses rim 11. In the embodiment, the top-side edge 131 of the glasses lens 13 may avoid a portion of the connection wire 17 through the clearance slot 1311, so that the top-side edge 131 may further extend towards the bottom of the first mounting groove 111 relative to the clearance slot 1311 and abut on the abutting portions 1722 on the two sides of the protruding portion 1721. Therefore, the space occupied by the connection wire 17 in the first mounting groove 111 may be reduced to a certain extent, so that the glasses lens 13 may be installed deeper inside the first mounting groove 111, thereby improving the stability of the glasses lens 13 in the glasses rim 11.

In an application scenario, the glasses rim 11 may be thin, and at least a portion of the protruding portion 1721 may be exposed outside the first mounting groove 111 to reduce the space of the glasses rim occupied by the connection wire 17, thereby reducing the depth of the first mounting groove 111 and improving the stability of the glasses rim 11.

Figure 12:
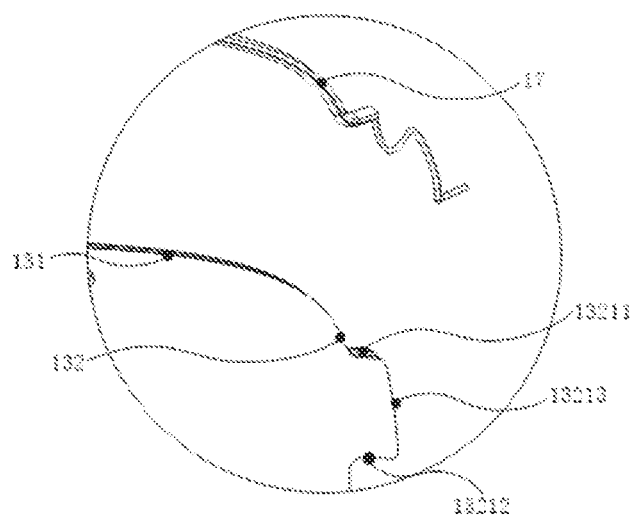
FIG. 12 is a partial structural schematic diagram illustrating part B of a speaker in FIG. 7 according to some embodiments of the present disclosure.

As used herein, further referring to FIG. 2 and FIG. 12, FIG. 12 is a partial structural diagram illustrating part B in FIG. 7 according to some embodiments of the present disclosure. In one embodiment, the first buckle 1321 may include a first sub-edge 13211, a second sub-edge 13212, and a third sub-edge 13213.

As used herein, the first sub-edge 13211 may be disposed adjacent to the top-side edge 131. The second sub-edge 13212 may be disposed away from the top-side edge 131 and opposite to the first sub-edge 13211. The third sub-edge 13213 may be connected to the first sub-edge 13211 and the second sub-edge 13212 on a side of the first sub-edge 13211 and the second sub-edge 13212 away from the glasses lens 13.

In the embodiment, the wire protection cover 172 may further extend to the first buckle groove 112 along the first sub-edge 13211.

In the way, the wire protection cover 172 may be held in the first mounting groove 111 and extend to the first buckle groove 112 to be hidden in the glasses rim 11. Therefore, when a user disassembles the glasses lens 13 during use, the wire protection cover 172 may not be exposed after the glasses lens 13 is disassembled to maintain the beauty of the glasses.

Further, when extending towards the first buckle groove 112, the wire protection cover 172 may end at a connection between the first sub-edge 13211 and the third sub-edge 13213. Certainly, the wire protection cover 172 may also not end and continue to extend along the wire body 171, as long as the wire protection cover 172 is not exposed when the glasses lens 13 is disassembled.

Figure 13:
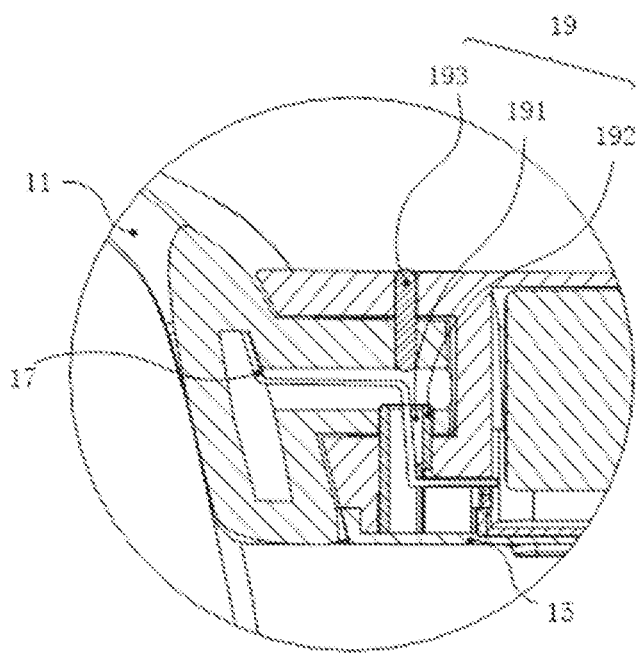
FIG. 13 is an enlarged sectional view illustrating a partial structure of glasses in a speaker according to some embodiments of the present disclosure.

Referring to FIG. 13 together, FIG. 13 is an enlarged sectional view illustrating a partial structure of glasses according to an embodiment of the present disclosure. In the embodiment, the glasses may further include rotating shaft(s) 19.

As used herein, the count of the rotating shaft(s) 19 may be two, and be respectively used to connect the glasses rim 11 and the two glasses temples 15 so that the glasses rim 11 and the glasses temples 15 may rotate relative to the rotating shaft 19. As used herein, the rotating shaft 19 may be disposed with a rotating shaft wiring channel 191 in an axial direction. The connection wire 17 may be disposed inside the shaft wiring channel 191 and extend to the glasses rim 11 and the glasses temples 15, respectively.

Specifically, in the embodiment, after the connection wire 17 passes through the rotating shaft wiring channel 191, one end of the connection wire 17 may extend directly to one of the glasses temples 15, and the other end of the connection wire 17 may enter the glasses rim 11 and further extend to another one of the glasses temples 15 along the first mounting groove 111, thereby electrically connecting the two function components 16 located inside the two glasses temples 15, respectively.

In the embodiment, the connection wire 17 near the rotating shaft wiring channel may not include the wire protection cover 172. The rotating shaft wiring channel 191 may pass through the rotating shaft 19.

It may be easy to understand that relative positions of structures near the rotating shaft 19 may change when the glasses rim 11 and the glasses temple 15 are folded. At this time, if the connection wire 17 located at the connection between the glasses rim 11 and the glasses temple 15 is directly disposed around the periphery of the rotating shaft 19, the connection wire 17 herein may be compressed or pulled, even deformed or broken with the folding of glasses rim 11 or glasses temples 15, which may affect the stability of the connection wire 17 and shorten the service life of the connection wire 17.

In the embodiment, the rotating shaft 19 may be disposed with the shaft wiring channel 191 along the axial direction. The connection wire 17 located at the connection between the glasses rim 11 and the glasses temple 15 may pass through the shaft wiring channel 191. Therefore, when the glasses rim 11 and the glasses temple 15 are folded, the connection wire 17 located inside the rotating shaft wiring channel 191 may only generate a certain amount of rotation with the rotation of the rotating shaft 19 to reduce the folding, compressing or pulling of the connection wire 17, thereby protecting the connection wire 17 to a certain extent, improving the stability of the connection wire 17, and extending the service life of the connection wire 17.

As used herein, in the embodiment, an inner diameter of the rotation shaft wiring channel 191 may be larger than an outer diameter of the connection wire 17. For example, the inner diameter of the shaft wiring channel 191 may be twice the outer diameter of the connection wire 17. Accordingly, a binding effect of the inner side wall of the axis wiring channel 191 on the connection wire 17 may be reduced, thereby reducing the rotation of the connection wire 17 when the glasses rim 11 and the glasses temple 15 are folded.

Figure 14:
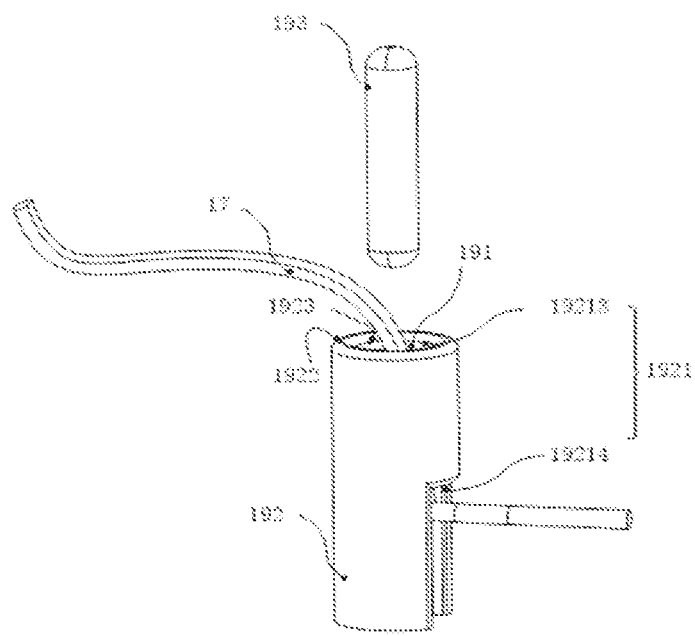
FIG. 14 is a schematic structural diagram illustrating a rotating shaft component and a connection wire in a speaker according to some embodiments of the present disclosure.

Referring to FIG. 13 and FIG. 14 together, FIG. 14 is a schematic structural diagram illustrating a rotating shaft and a connection wire of glasses according to an embodiment of the present disclosure. In the embodiment, the rotating shaft 19 may include a first rotating shaft 192. Two ends of the first rotating shaft 192 may be respectively connected to the glasses rim 11 and the glasses temple 15. The rotating shaft wiring channel 191 may be disposed along an axial direction of the first rotating shaft 192. The shaft wiring channel 191 may communicate with the outside through a wiring port 1921 disposed on at least one end surface of the first rotating shaft 192. The connection wire 17 may extend to the glasses rim 11 or the glasses temples 15 through the wiring port 1921.

It should be noted that, in the embodiment, the first rotating shaft 192 may be rotatably connected to one of the glasses rim 11 and the glasses temples 15, and fixedly connected to another, so that the glasses rim 11 and the glasses temples 15 may be rotatably connected around the first rotating shaft 192.

Specifically, in the embodiment, the rotating shaft wiring channel 191 may be disposed inside the first rotating shaft 192, and further communicate with the outside through the wiring port 1921.

Specifically, the rotating shaft wiring channel 191 may penetrate at least one end surface of the first rotating shaft 192 to form the wiring port 1921 of the rotating shaft wiring channel 191. Therefore, the connection wire 17 may extend from the shaft wiring channel 191 through the at least one end surface of the first rotating shaft 192, and then extend to the glasses rim 11 or the glasses temples 15. It may be easy to understand that the periphery of the end surface of the first rotating shaft 192 may have a relatively large movement space. The connection wire 17 extending from the end surface of the first rotating shaft 192 may be accommodated inside the movement space. And if the first rotating shaft 192 at the end face is rotatably connected to the corresponding glasses rim 11 or glasses temple 15, when the glasses rim 11 and the glasses temple 15 fold and rotate, the movement space may be appropriately buffered a twist of the connection wire 17 near the wiring port 1921 on the end surface with the rotation of the first rotating shaft 192, thereby further reducing the twisting degree of the connection wire 17 and improving the stability of connection wire 17.

Figure 15:
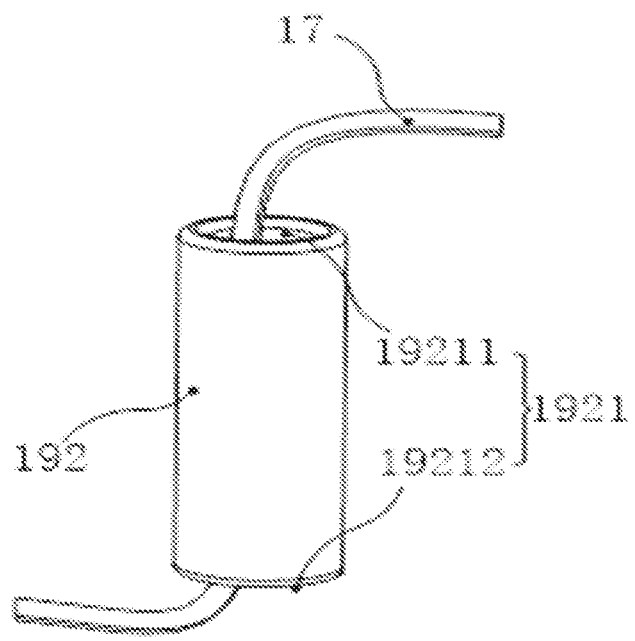
FIG. 15 is a schematic structural diagram illustrating a first rotating shaft in a speaker according to some embodiments of the present disclosure.

Referring to FIG. 15, FIG. 15 is a schematic structural diagram illustrating a first rotating shaft of glasses according to an embodiment of the present disclosure. In the embodiment, the wiring port 1921 may include a first wiring port 19211 and a second wiring port 19212 respectively disposed on two ends of the first rotating shaft 192. The rotating shaft wiring channel 191 may communicate with the outside through the two wiring ports 1921, so that the connection wire 17 may pass through the two ends of the first rotating shaft 192 and extend to the glasses rim 11 and the glasses temple 15 through the first wiring port 19211 and the second wiring port 19212, respectively.

In other words, in the application scenario, the connection wire 17 at the connection between the glasses rim 11 and the glasses temple 15 may be disposed inside the rotating shaft wiring channel 191 in the first rotating shaft 192, and extend from the rotating shaft wiring channel 191 through the two ends of the first rotating shaft 192, respectively. At this time, since large movement spaces exist on the periphery of two end surfaces of the first rotating shaft 192, the connection wire 17 extending from the two end surfaces of the first rotating shaft 192 may only move or twist slightly without compressing or deforming when the relative rotation occurs between the glasses rim 11 and the glasses temple 15.

Referring to FIG. 14, in the embodiment, the wiring port 1921 may include a first wiring port 19213 and a second wiring port 19214. As used herein, the first wiring port 19213 may be disposed on an end surface of the first rotating shaft 192, and the second wiring port 19214 may be disposed on a side wall of the first rotating shaft 192. Therefore, one end of the shaft wiring channel 191 may penetrate the end surface of the first rotating shaft 192 in the axial direction through the first wiring port 19213, and the other end may penetrate the side wall of the first rotating shaft 192 through the second wiring port 19214, and then communicate with the outside. The connection wire 17 may extend to the glasses rim 11 and the glasses temple 15 through the first wiring port 19213 and the second wiring port 19214, respectively.

Similarly, a large movement space may be disposed near the end face of the first rotating shaft 192 of the first wiring port 19213. When a relative movement occurs between the glasses rim 11 and the glasses temple 15, the connection wire 17 near the first wiring port 19213 may only undergo a relative shift, or a small twist.

In an application scenario, the first rotating shaft 192 may be fixedly connected to one of the glasses rim 11 and the glasses temple 15 disposed near the second wiring port 19214, and rotatably connected to another of the glasses rim 11 and the glasses temple 15 disposed near the first wiring port 19213. That is, the first rotating shaft 192 may be rotatably connected to one of the glasses rim 11 or the glasses temple 15 at the wiring port 1921 disposed on the end surface. The first rotating shaft 192 may be fixedly connected to another of the glasses rim 11 or the glasses temple 15 at the wiring port 1921 disposed on the side wall.

In an application scenario, the first rotating shaft 192 may be closed to the glasses rim 11 at the first wiring port 19213, and rotatably connected to the glasses rim 11. The first rotating shaft 192 may be closed to the glasses temple 15 at the second wiring port 19214, and fixedly connected to the glasses temple 15.

It should be noted that, in this application scenario, the first rotating shaft 192 is rotatably connected to the glasses rim 11, and the relative rotation between the glasses rim 11 and the glasses temple 15 may cause the relative movement of the connection wire 17 at the first wiring port 19213. However, since the first wiring port 19213 is disposed on the end surface of the first rotating shaft 192, similar to the embodiment described above, the end surface of the first rotating shaft 192 may have a large movement space. When the glasses rim 11 and the glasses temple 15 are folded and rotated, and the connection wire 17 near the wiring port 1921 on the end surface is twisted to a certain extent with the rotation of the first rotating shaft 192, the movement space may be appropriately buffered, and the twist may be turned into a shift or a small twist, without compressing or pulling the connection wire, thereby improving the stability of the connection wire and extending the service life of the connection wire.

In addition, the first rotating shaft 192 may be fixedly connected to the glasses temple 15 at the second wiring port 19214. It may be easy to understand that the glasses temple 11 and the first rotating shaft 192 may be synchronized when the relative rotation occurs between the glasses rim 11 and the glasses temple 15. Hence, the connection wire 17 in the shaft wiring channel 191 may extend through the second wiring port 19214 into the connection wire 17 of the glasses temple 15 without twisting, compressing, or puffing. Therefore, at this time, the second wiring port 19214 may be disposed on the end surface of the first rotating shaft 192 or on the side wall of the first rotating shaft 192. The relative rotation between glasses rim 11 and glasses temple 15 may not cause the twisting, compressing, pulling, etc., of the connection wire 17 herein.

In other embodiments, if the first rotating shaft 192 and the glasses temple 15 are rotatably connected at the second wiring port 19214, the relative rotation between thereof may allow the connection wire 17 to move, which may be constrained by the side wall of the first rotating shaft at the second wiring port 19214, so that the connection wire 17 may be compressed between the side wall of the first rotating shaft and the glasses temple 15.

If the first rotating shaft 192 is near the glasses temple 15 at the first wiring port 19213 and rotatably connected to the glasses temple 15, the first rotating shaft 192 may be near the glasses rim 11 at the second wiring port 19214 and fixedly connected to the glasses rim 11. For the same reason, when the glasses rim 11 and the glasses temple 15 are folded, the connection wire 17 inside the rotating shaft wiring channel 191 and near the first wiring port 19213 and the second wiring port 19214 may be still only slightly twisted or moved.

Referring to FIG. 14, in one embodiment, the rotating shaft 19 may further include a second rotating shaft 193 coaxial with and spaced from the first rotating shaft 192.

In the embodiment, the second rotating shaft 193 may be disposed on a side of the first rotating shaft 192 near the first wiring port 19213. Certainly, in other embodiments, the second rotating shaft 193 may also be disposed on a side of the first rotating shaft 192 closed to the second wiring port 19214.

Figure 16:
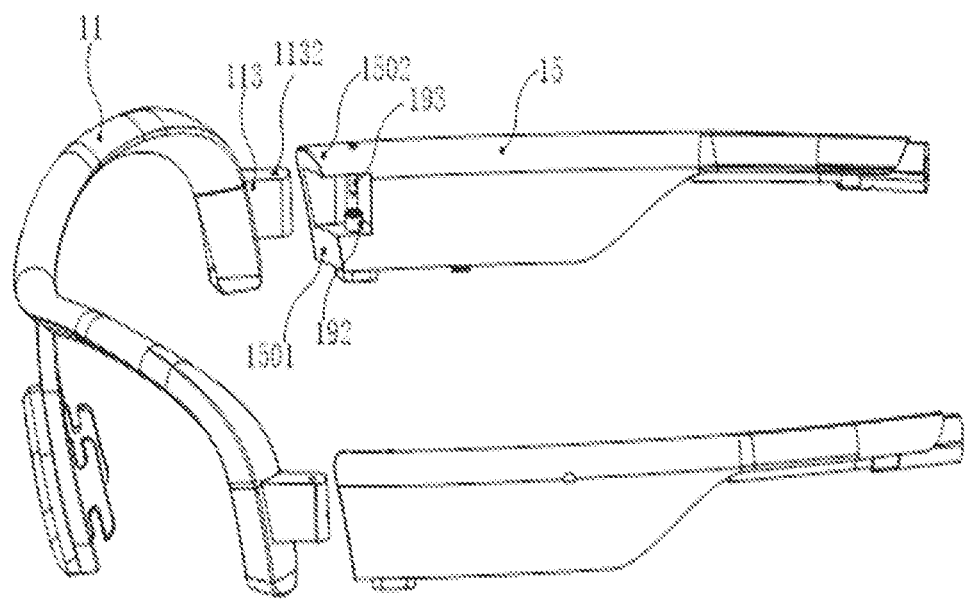
FIG. 16 is a partial exploded view illustrating a speaker according to some embodiments of the present disclosure.

Referring to FIG. 16, FIG. 16 is a partial exploded view illustrating glasses according to an embodiment of the present disclosure. In the embodiment, the glasses rim 11 may include first lug(s) 113. Specifically, the count of the first lug(s) 113 may be two, and be respectively disposed at two ends of the glasses rim 11 connecting to the two glasses temples 15 and protrude towards the corresponding glasses temples 15.

The glasses temple 15 may include a second lug 1501 and a third lug 1502 disposed at intervals. As used herein, the second lug 1501 and the third lug 1502 may face ends of the glasses rim 11 connected to the glasses temple 15 at which the lugs are located. In addition, when the user wears the glasses, the second lug 1501 and the third lug 1502 may be connected to a side away from the head of the user, thereby making the glasses more overall and more beautiful in appearance. In an application scenario, the second lug 1501 and the third lug 1502 disposed at intervals may be formed by disposing a groove in the middle of an end of the glasses temple 15 facing the glasses rim 11.

Further, ends of the first rotating shaft 192 and the second rotating shaft 193 closed to each other may be connected to the first lug 113. Ends of the first rotating shaft 192 and the second rotating shaft 193 away from each other may be connected to the second lug 1501 and the third lug 1502, respectively, so as to maintain the first lug 113 between the second lug 1501 and the third lug 1502.

As used herein, referring to FIG. 14 continuously, in one embodiment, the first wiring port 19213 may be disposed on an end surface of the first rotating shaft 192 near the second rotating shaft 193. The second wiring port 19214 may be disposed on a side wall of the first rotating shaft near the second lug 1501. The first rotating shaft may be rotatably connected to the first lug 113 and fixedly connected to the second lug 1501.

Specifically, in the embodiment, one end of the connection wire 17 inside the rotating shaft wiring channel 191 may extend from the first wiring port 19213 and pass through an interval between the first rotating shaft 192 and the second rotating shaft 193. Further, in an application scenario, the first lug 113 may be disposed with a wiring channel connected to the first wiring port 19213, so that the connection wire 17 may further enter the glasses rim 11 from the first lug 113.

In addition, the other end of the connection wire 17 inside the rotating shaft wiring channel 191 may extend from the second wiring port 19214. Further, in an application scenario, the third lug 1502 may be disposed with a wiring channel communicating with the second wiring port 19214, so that the connection wire 17 may further enter the glasses temple 15 through the wiring channel of the third lug 1502.

As used herein, the second wiring port 19214 may be a through-hole disposed on a side wall of the first rotating shaft 192, and communicated with the rotating shaft wiring channel 191 without penetrating an end of the first rotating shaft 192. In the embodiment, the second wiring port 19214 may be further penetrated along the side wall of the first rotating shaft 192 to an end of the first rotating shaft 192 away from the first wiring port 19213. It may be easy to understand that, in the embodiment, the second wiring port 19214 may have a larger space. Therefore, when the connection wire 17 is moved for some reason, the restriction on the connection wire 17 may be further reduced, and the damage to the side wall of the first rotating shaft 192 may be further reduced.

Figure 17:
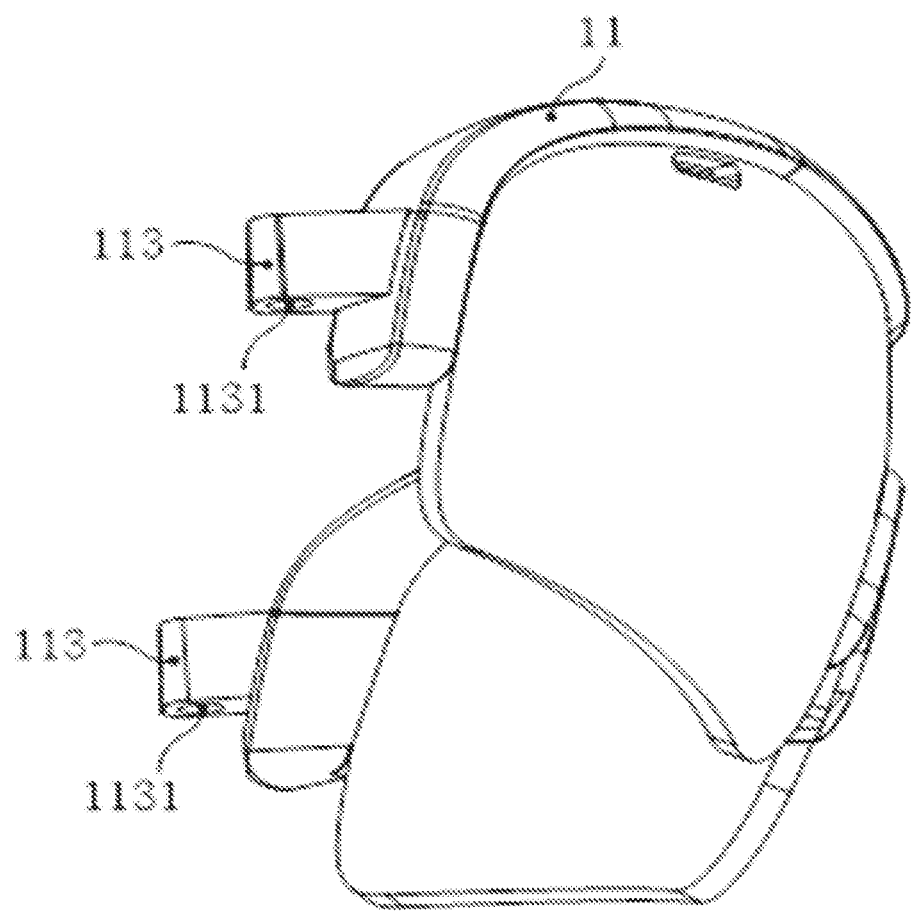
FIG. 17 is a schematic structural diagram illustrating a glasses rim and a glasses lens in a speaker according to some embodiments of the present disclosure.
Figure 18:
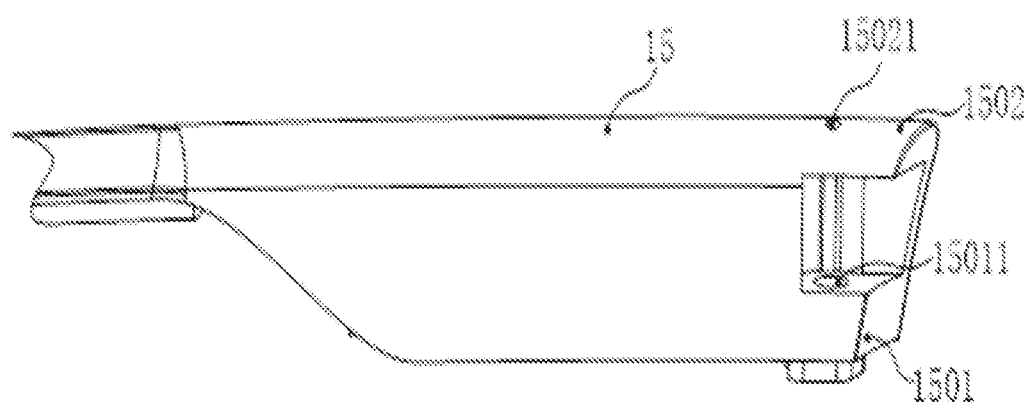
FIG. 18 is a schematic diagram illustrating a partial structure of a glasses temple in a speaker according to some embodiments of the present disclosure.

Referring to FIG. 16, FIG. 17, and FIG. 18 together, FIG. 17 is a schematic structural diagram illustrating a glasses rim and a glasses lens of glasses according to an embodiment of the present disclosure, and FIG. 18 is a partial structural schematic diagram illustrating a glasses temple of glasses according to an embodiment of the present disclosures. In the embodiment, the first lug 113 and the second lug 1501 may be coaxially disposed with a first accommodating hole 1131 and a second accommodating hole 15011, respectively. Sizes of the first accommodating hole 1131 and the second accommodating hole 15011 may be set to allow the first rotating shaft 192 to be inserted into the first accommodating hole 1131 from the outside of the glasses temple 15 through the second accommodating hole 15011, such that the first rotating shaft 192 may be in an interference fit with the second accommodating hole 15011 and in a clearance fit with the first accommodating hole 1131.

Specifically, the second accommodating hole 15011 may be a through-hole penetrating the second lug 1501. The first accommodating hole 1131 may correspond to the second accommodating hole 15011 and penetrate at least a portion of the first lug 113. As used herein, an inner diameter of the first accommodating hole 1131 may be larger than the second accommodating hole 15011. An outer diameter of the first rotating shaft 192 may be between the first accommodating hole 1131 and the second accommodating hole 15011. Therefore, the first rotating shaft 192 may be fixedly connected to the glasses temple 15 and rotatably connected to the glasses rim 11 so that the glasses rim 11 and the glasses temple 15 may be rotated around the first rotating shaft 192 to be folded or unfolded.

Further, in an embodiment, the first lug 113 and the third lug 1502 may be coaxially disposed with a third accommodating hole 1132 and a fourth accommodating hole 15021, respectively. Sizes of the third accommodating hole 1132 and the fourth accommodating hole 15021 may be set to allow the second rotating shaft 193 to be inserted into the third accommodating hole 1132 from the outside of the glasses temple 15 via the fourth accommodating hole 15021, such that the second rotating shaft 193 may be in an interference fit with the third accommodating hole 1132 and in a clearance fit with the fourth accommodating hole 15021, or the second rotating shaft 193 may be in a clearance fit with the third accommodating hole 1132 and in an interference fit with the fourth accommodating hole 15021.

In the embodiment, the third accommodating hole 1132 and the fourth accommodating hole 15021 may be coaxial with both the first accommodating hole 1131 and the second accommodating hole 15011. As used herein, the third accommodating hole 1132 may penetrate at least a portion of the first lug 113. In one application scenario, the first accommodating hole 1131 and the third accommodating hole 1132 may be coaxially penetrated. Specifically, as described in the above embodiment, the first lug 113 of the glasses rim 11 may be disposed with a wiring channel connected to the first wiring port 19213. The first accommodating hole 1131 and the third accommodating hole 1132 may be respectively disposed on both sides of the wiring channel located inside the first lug 113 and both pass through the wiring channel. The fourth accommodating hole 15021 may penetrate the third lug 1502. As used herein, the outer diameter of the second rotating shaft 193 may be between the inner diameter of the third accommodating hole 1132 and the inner diameter of the fourth accommodating hole 15021. The inner diameter of the third accommodating hole 1132 may be larger than the fourth accommodating hole 15021. Alternatively, the inner diameter of the fourth accommodating hole 15021 may be larger than the third accommodating hole 1132. Therefore, the second rotating shaft 193 may be fixedly connected to the glasses temple 15 and rotatably connected to the glasses rim 11, or the second rotating shaft 193 may be fixedly connected to the glasses rim 11 and rotatably connected to the glasses temple 15, so that the glasses rim 11 and the glasses temple 15 may be rotated around the first rotating shaft 192 to be folded or unfolded.

In one embodiment, the second rotating shaft 193 may be a solid shaft, and the diameter may be less than that of the first rotating shaft 192. In the wearing state, the second rotating shaft 193 may be located on the upper side of glasses temple 15, and the first rotating shaft may be located on the lower side of glasses temple 15.

It should be noted that, since the rotating shaft wiring channel 191 may be disposed inside the first rotating shaft 192, the outer diameter of the first rotating shaft 192 may be larger, which may adversely satisfy aesthetic needs of the user. Therefore, in the embodiment, the second rotating shaft 193 having a smaller outer diameter may be further disposed. Hence, when the user wears the glasses, the second rotating shaft 193 may be disposed on an upper portion that is easily found, and the first rotating shaft 192 may be disposed on a lower portion that is not easily observed. Since the outer diameter of the second rotating shaft 193 is smaller, the overall aesthetic effect of the glasses may be improved to a certain extent.

Certainly, in other embodiments, the first rotating shaft 192 and the second rotating shaft 193 may also be other cases. For example, the second rotating shaft 193 may also be a hollow shaft, and the diameter of the second rotating shaft 193 may be larger than the diameter of the first rotating shaft 192. Alternatively, in the wearing state, the second rotating shaft 193 may be disposed on a lower side of the glasses temple 15, and the first rotating shaft 192 may be disposed on an upper side of the glasses temple 15, or the like, and be not limited herein.

In addition, referring to FIG. 14, a connection between an end surface 1922 of the first rotating shaft 192 for disposing the first wiring port 19213 and an inner wall surface 1923 of the first rotating shaft 192 for defining the rotating shaft wiring channel 191 may be arc-shaped. It may be easy to understand that, when the rotation between the glasses rim 11 and the glasses temple 15 through the rotating shaft 19 occurs, since the first rotating shaft 192 and the glasses rim 11 are rotatably connected, the connection wire 17 at the first wiring port 19213 may be moved. In the embodiment, the connection between the end surface 1922 of the first rotating shaft 192 and the inner wall surface 1923 may be arc-shaped. Therefore, when the connection wire 17 at the first wiring port 19213 moves and contacts with the first rotating shaft 192, the connection wire 17 may be avoided to be cut if the connection is too sharp, thereby further protecting the connection wire 17.

In an application scenario, a connection between the end surface of the first rotating shaft 192 for disposing the second wiring port 19214 and the inner wall surface 1923 of the first rotating shaft 192 for defining the rotating shaft wiring channel 191 may also be arc-shaped. Similarly, in this way, the connection wire 17 may be further protected.

It should be noted that the above description of the rotating shaft and wiring in the glasses may be only specific examples, and should be not considered as the only feasible implementation. Obviously, for those skilled in the art, after understanding the basic principle of the rotating shaft and wiring in the glasses, it may be possible to make various modifications and changes in the form and details of the specific manner and operation of implementing the rotating shaft and wiring in the glasses without departing from these principles, but these modifications and changes are still within the scope described above. For example, the branch circuit board may also include a third pad and a third flexible circuit board. All such variations may be within the protection scope of the present disclosure.

Referring to FIG. 1, in some embodiments, the speaker (e.g., a bone conduction speaker, an air conduction speaker, etc.) on the glasses may include the earphone core 102 and the core housing 108. As used herein, bone conduction is a kind of sound conduction manner, which converts the sound into mechanical vibrations with different frequencies and transmits sound waves through human skull, bone labyrinth, inner ear lymphatic transmission, organum spirale, auditory nerve, auditory center, etc.

In typical cases, the sound quality of the speaker may be affected by various factors such as the physical properties of components of the speaker, vibration transmission relationship(s) between the components, a vibration transmission relationship between the speaker and the outside, and the efficiency of a vibration transmission system when vibration is transmitted. The components of the speaker may include a component that generates the vibration (e.g., but is not limited to a transducing device), a component that fixes the speaker (e.g., but is not limited to a glasses rim), and a component that transmits the vibration (e.g., but is not limited to a panel, a vibration transmission layer, etc.). The vibration transmission relationship(s) between the components and the vibration transmission relationship between the speaker and the outside may be determined by a contact mode (e.g., but is not limited to, a clamping force, a contact area, a contact shape, etc.) between the speaker and the user.

Figure 19:
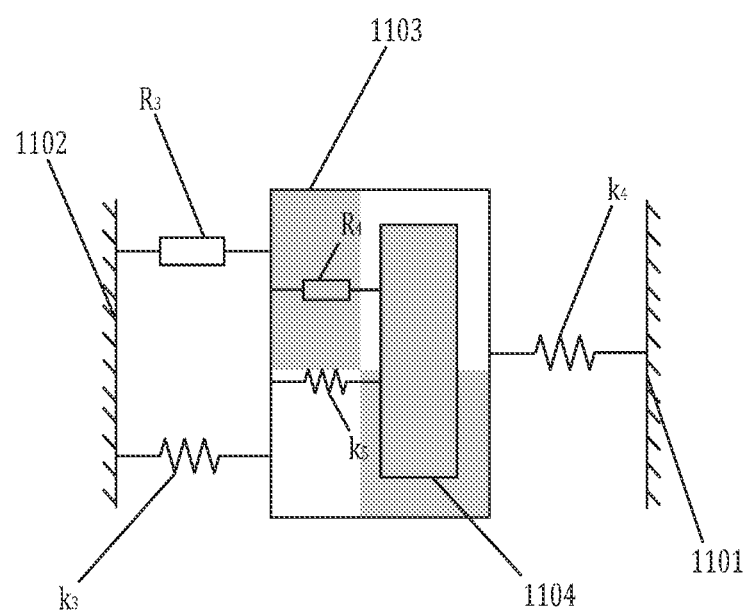
FIG. 19 is an equivalent model illustrating a vibration generation and transmission system of a speaker according to some embodiments of the present disclosure.

For the purpose of illustration only, relationship(s) between the sound quality and the components of the speaker may be further described below based on the speaker. It may need to be known that the contents described below may also be applied to an air conduction speaker without violating the principle. FIG. 19 is an equivalent model illustrating a vibration generation and transmission system of a speaker according to some embodiments of the present disclosure. As shown in FIG. 19, it may include a fixed end 1101, a sensing terminal 1102, a vibration unit 1103, and a transducing device 1104. As used herein, the fixed end 1101 may be connected to the vibration unit 1103 based on a transmission relationship K1 ($k_4$ in FIG. 19). The sensing terminal 1102 may be connected to the vibration unit 1103 based on a transmission relationship K2 ($R_3$, $k_3$ in FIG. 19). The vibration unit 1103 may be connected to the transducing device 1104 based on a transmission relationship K3 ($R_4$, $k_5$ in FIG. 19).

The vibration unit mentioned herein may be a vibrating body including a panel and a transducing device. The transmission relationships K1, K2, and K3 may be descriptions of functional relationships between corresponding portions of an equivalent system of the speaker (described in detail below). The vibration equation of the equivalent system may be expressed as:

$$m_3 x''_3 + R_3 x'_3 - R_4 x'_4 + (k_3+k_4)x_3 + k_5(x_3-x_4) = f_3 \quad (1)$$

$$m_4 x''_4 + R_4 x''_4 - k_5(x_3-x_4) = f_4 \quad (2)$$

where $m_3$ is an equivalent mass of the vibration unit 1103, $m_4$ is an equivalent mass of the transducing device 1104, $x_3$ is an equivalent displacement of the vibration unit 1103, $x_4$ is an equivalent displacement of the transducing device 1104, $k_3$ is an equivalent elastic coefficient between the sensing terminal 1102 and the vibration unit 1103, $k_4$ is an equivalent elastic coefficient between the fixed end 1101 and the vibration unit 1103, $k_5$ is an equivalent elastic coefficient between the transducing device 1104 and the vibration unit 1103, $R_3$ is an equivalent damping between sensing terminal 1102 and vibration unit 1103, $R_4$ is an equivalent damping between the transducing device 1104 and the vibration unit 1103, and $f_3$ and $f_4$ are interaction forces between the vibration unit 1103 and the transducing device 1104, respectively. An equivalent amplitude $A_3$ of the vibration unit in the system may be:

$$A_3 = -\frac{m_4 \omega^2}{(m_3\omega^2 + j\omega R_3 - (k_3+k_4+k_5))(m_4\omega^2 + j\omega R_4 - k_5) - k_5(k_5 - j\omega R_4)} \cdot f_0 \quad (3)$$

where $f_0$ denotes a driving force unit, and $\omega$ denotes a vibration frequency. It may be seen that factors affecting a frequency response of a bone conduction speaker may include a vibration generation portion (e.g., but is not limited to a vibration unit, a transducing device, a housing, and interconnection manners, such as $m_3$, $m_4$, $k_5$, $R_4$, etc., in equation (3)), a vibration transmission portion (e.g., but is not limited to, a contact manner with the skin, and properties of the glasses rim, such as $k_3$, $k_4$, $R_3$, etc., in the equation (3)). The change of structures of the components of the speaker and parameters of connections between the components may change the frequency response and sound quality of the bone conduction speaker. For example, the change of a clamping force may be equivalent to changing the size of $k_4$. The change of a bonding manner of glue may be equivalent to changing the size of $R_4$ and $k_5$. The change of the hardness, elasticity, damping, etc., of a relevant material may be equivalent to changing the size of $k_3$ and $R_3$.

In a specific embodiment, the fixed end 1101 may be points or regions (e.g., a top of an ear hook) relatively fixed in the bone conduction speaker during the vibration. These points or regions may be regarded as the fixed end of the bone conduction speaker during the vibration. The fixed end may constitute a specific component, or a position determined according to the overall structure of the bone conduction speaker. For example, the bone conduction speaker may be hung, bonded, or adsorbed near human ears by a specific device. The structure and shape of the bone conduction speaker may be designed so that a bone conduction part may be attached to the human skin.

The sensing terminal 1102 may be a hearing system for the human body to receive sound signal(s). The vibration unit 1103 may be portions of the bone conduction speaker for protecting, supporting, and connecting the transducing device, including portions that directly or indirectly contact the user, such as a vibration transmission layer or panel (a side of the core housing near the body) that transmits the vibration to the user, a housing that protects and supports other vibration-generating units, etc. The transducing device 1104 may be a sound vibration generating device, which may be one or more the transducing devices discussed above or any combination thereof.

The transmission relationship K1 may connect the fixed end 1101 and the vibration unit 1103, and represent a vibration transmission relationship between a vibration generating portion and the fixed end during the work of the bone conduction speaker. K1 may be determined according to the shape and structure of the bone conduction device. For example, the bone conduction speaker may be fixed to the human head in the form of a glasses frame, or installed on a helmet, fire mask or other special-purpose masks, glasses, etc. The shapes and structures of different bone conduction speakers may affect the vibration transmission relationship K1. Further, the structure of the speaker may also include physical properties such as composition materials, qualities, etc., of different portions of the bone conduction speaker. The transmission relationship K2 may connect the sensing terminal 402 and the vibration unit 1103.

K2 may be determined according to the composition of the transmission system. The transmission system may include but be not limited to transmitting sound vibration to the hearing system through tissues of the user. For example, when the sound is transmitted to the hearing system through the skin, subcutaneous tissues, bones, etc., the physical properties of different human tissues and their interconnections may affect K2. Further, the vibration unit 1103 may be in contact with the human tissue. In different embodiments, a contact surface on the vibration unit may be a side of a vibration transmission layer or panel. A surface shape, size of the contact surface, and an interaction force with the human tissue may affect the transmission relationship K2.

The transmission relationship K3 between the vibration unit 1103 and the transducing device 1104 may be determined by connection properties inside the vibration generating device of the bone conduction speaker. The transducing device and the vibration unit may be connected in a rigid or elastic manner. Alternatively, the change of a relative position of a connecting piece between the transducing device and the vibration unit may change the transmission device to transmit the vibration to the vibrating unit (in particular, the transmission efficiency of the panel), thereby affecting the transmission relationship K3.

During the use of the bone conduction speaker, the sound generation and transmission process may affect the final sound quality felt by the human body. For example, the above-mentioned fixed end, the human sensing terminal, the vibration unit, the transducing device, and the transmission relationships K1, K2, and K3, etc., may all affect the sound quality of the bone conduction speaker. It should be noted that K1, K2, and K3 are only a representation of the connection modes of different device portions or systems involved in the vibration transmission process, and may include, but be not limited to, a physical connection manner, a force transmission manner, the sound transmission efficiency, or the like.

It should be noted that the above description of the bone conduction speaker is only a specific example, and should not be regarded as the only feasible implementation solution. Obviously, for those skilled in the art, after understanding the basic principle of the bone conduction speaker, it may be possible to make various modifications and changes in the form and details of the specific method and operation of implementing the bone conduction speaker without departing from these principles, but these modifications and changes are still within the scope described above. For example, the above-mentioned K1, K2, and K3 may be simple vibrations or mechanical transmission manners. Or, the above-mentioned K1, K2, and K3 may include a complex nonlinear transmission system. The transmission relationship may be formed by a direct connection of each part or transmitted in a non-contact manner.

Referring to FIG. 19, the transmission relationship K2 between the sensing terminal 1102 and the vibration unit 1103 (i.e., the core housing) may also affect the frequency response of the bone conduction system. The sound heard by the human ear depends on energy received by a cochlea. The energy may be affected by different physical quantities during transmission, which may be expressed as the follow equation:

$$P=\iint_S \alpha \cdot f(a,R) \cdot L \cdot ds \quad (4)$$

where P is proportional to the energy received by the cochlea. S is an area that a contact surface 502a contacts with a human face. α is a dimension conversion coefficient. f(a, R) denotes influence of an acceleration a of a point on the contact surface and a degree of tightness R between the contact surface and the skin on an energy transmission. L is an impedance of the transmission of the mechanical wave on any contact point, i.e., a transmission impedance per unit area.

Based on Equation (4), the transmission of sound is affected by the transmission impedance L. Vibration transmission efficiency of the bone conduction system is related to L. A frequency response curve of the bone conduction system may be a superposition of frequency response curves of all points on the contact surface. Factors affecting the impedance may include a size, a shape, a roughness, a force, or a force distribution of the energy transmission area. For example, the sound transmission effect may be changed by changing a structure and a shape of the vibration unit, and then the sound quality of the bone conduction component may be changed. For example, the sound transmission effect may be changed by changing corresponding physical properties of the contact surface of the vibration unit.

Figure 20:
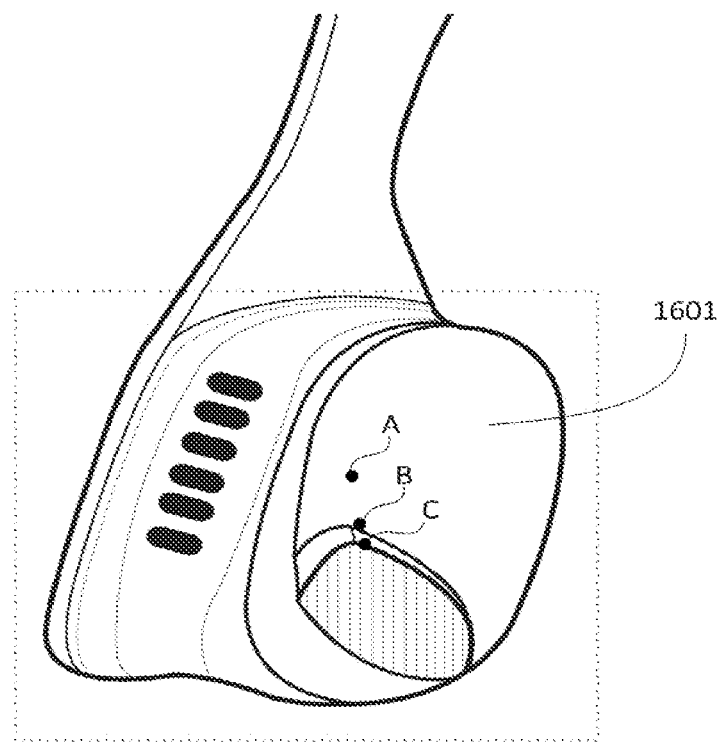
FIG. 20 is a schematic diagram illustrating a contact surface of a vibration unit of a speaker according to an embodiment of the present disclosure.

FIG. 20 is a schematic diagram illustrating a contact surface of a vibration unit of a speaker according to some embodiments of the present disclosure. In some embodiments, the contact surface of the vibration unit of the speaker in FIG. 20 corresponds to the outer wall of the functional module in FIG. 1 in contact with the human body. As used herein, the embodiment is a specific embodiment of the transmission relationship K2 between the sensing terminal 1102 and the vibration unit 1103. As shown in FIG. 20, a surface of a well-designed contact surface may be provided with a gradient structure. The gradient structure refers to a region where the surface of the contact surface has a height change. The contact surface mentioned herein is a side close to a user on the core housing. The gradient structure may be a raised/sunken or stepped structure existing on an outside of the contact surface (a side fitted to the user), or a raised/sunken or stepped structure existing on an inside of the contact surface (a side facing away from the user). It should be known that the contact surface of the vibration unit may be fitted to any position of the head of the user, for example, the top of the head, a forehead, a cheek, a temple, an auricle, the back of an auricle, etc. As shown in FIG. 20, the contact surface 1601 (the outside of the contact surface) may include a convex portion or a concave portion (not shown in FIG. 20). In a working process of the bone conduction speaker, the convex portion or the concave portion may contact with the user and change a pressure at different positions on the contact surface 1601 contacted with the face. The convex portion may be in closer contact with the face. Therefore, skin and subcutaneous tissue in contact with the convex portion may be under more pressure than other parts of the face. Accordingly, the skin and subcutaneous tissue in contact with the concave portion may be subjected to less pressure than other parts. For example, there are three points A, B and C on the contact surface 1601 in FIG. 20, which are located on a non-convex portion, an edge of the convex portion, and the convex portion of the contact surface 1601, respectively. When the contact surface 1601 is in contact with the skin, clamping forces on the skin at the three points A, B, and C may be FC>FA>FB. In some embodiments, the clamping force at point B is 0, i.e., point B does not contact with the skin. Facial skin and subcutaneous tissue may show different resistance and response to sound under different pressures. An impedance of a part with high pressure may be small, which may have a biased high-pass filtering characteristic for a sound wave. An impedance of a part with low pressure may be large, which may have a biased low-pass filtering characteristic for a sound wave. Impedance characteristics L of different parts of the contact surface 1601 may be different. According to Equation (4), frequency responses of different parts may be different when the sound is transmitted. Effect of the sound transmission through the whole contact surface may be equivalent to a sum of effects of the sound transmission through each part. Finally, when the sound is transmitted to the brain, a smooth frequency response curve may be formed to avoid that a resonance peak in low frequency or high frequency is too high. Therefore, an ideal frequency response in a whole audio bandwidth may be obtained. Similarly, a material and thickness of the contact surface 1601 may also affect the sound transmission, thereby affecting the effect of the sound quality. For example, when the material of the contact surface is soft, the transmission effect of the sound wave in the low-frequency range may be better than that in the high-frequency range. When the material of the contact surface is hard, the transmission effect of the sound wave in the high-frequency range may be better than that in the low-frequency range.

Figure 21:
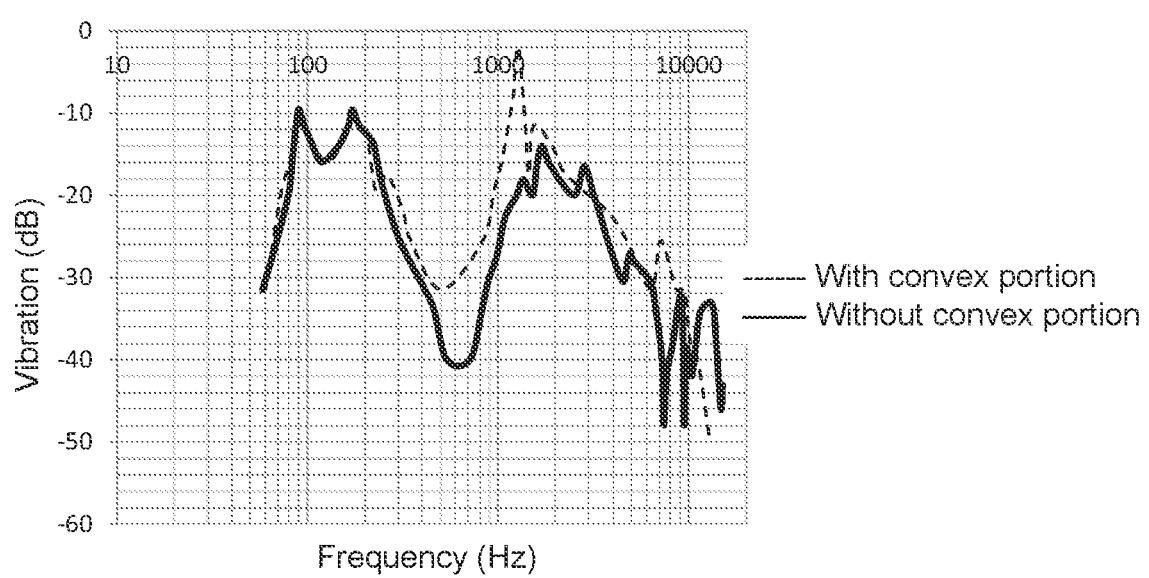
FIG. 21 is schematic diagram illustrating a vibration response curve of a speaker according to some embodiments of the present disclosure.

FIG. 21 shows frequency responses of a speaker with different contact surfaces. The dashed line corresponds to a frequency response of the speaker with a convex portion on the contact surface, while the solid line corresponds to a frequency response of the speaker without a convex portion on the contact surface. In a middle and low frequency range (e.g., in a range of 300 Hz to 1000 Hz), a vibration of the speaker without a convex portion may be significantly weakened compared with a vibration of the speaker with the convex portion. Therefore, a "pit" may be formed on the frequency response curve, which is not the ideal frequency response, thereby affecting the sound quality of the speaker.

The descriptions of FIG. 21 may be only an explanation for a specific example. For those skilled in the art, after understanding the basic principles of the influence on the frequency response of the speaker, it may be possible to perform various modifications and variations on the structure and component of the speaker to obtain different frequency response effect.

It should be noted that, for those skilled in the art, the shape and structure of the contact surface 1601 are not limited to the descriptions and may be satisfied other specific requirements. For example, the convex portion or concave portion of the contact surface may be distributed on the edge of the contact surface or in the middle of the contact surface. The contact surface may include one or more convex portions or concave portions, both of which may be distributed on the contact surface. The material of the convex portion or concave portion of the contact surface may be other materials different from the material of the contact surface. The material may be flexible, rigid, or more suitable for production of a specific pressure gradient. The material may be a memorized or non-memorized material. The material may be a single material or a composite material. A structural graphic of the convex portion or concave portion of the contact surface may include but not limited to an axisymmetric graphic, a central symmetric graphic, a rotational symmetric graphic, an asymmetric graphic, etc. The structural graphic of the convex portion or concave portion of the contact surface may be one type of graphic, or two or more combinations of graphics. The surface of the contact surface may include but not be limited to a certain degree of smoothness, roughness, waviness, etc. A position distribution of the convex portion or concave portion of the contact surface may include but not be limited to axial symmetry, central symmetry, rotational symmetry, asymmetric distribution, etc. The convex portion or concave portion of the contact surface may be at the edge of the contact surface or distributed in the contact surface.

Figure 22:
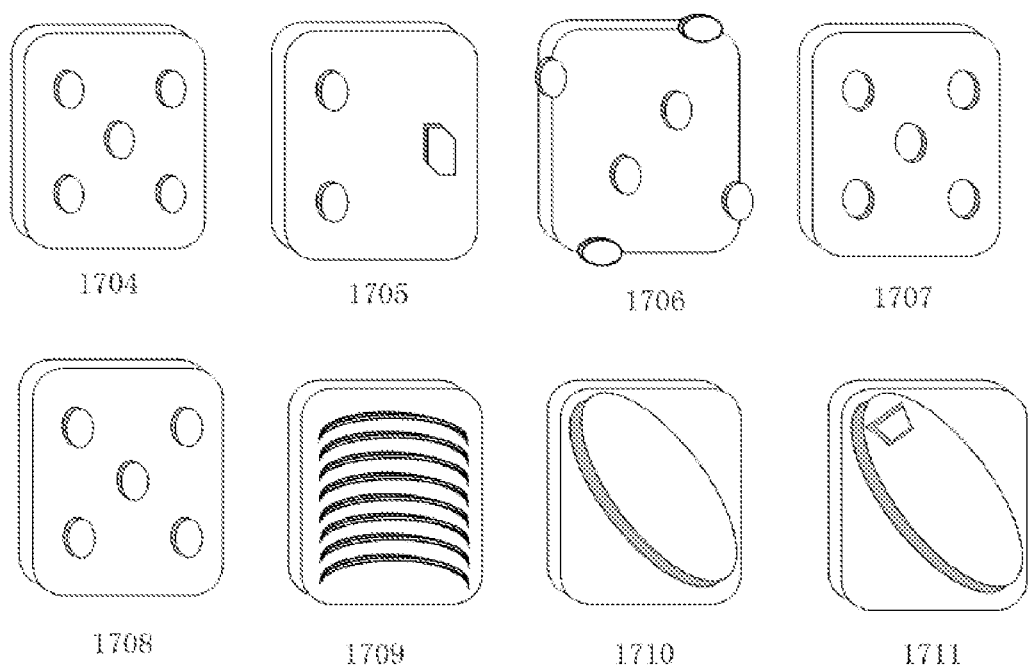
FIG. 22 is a schematic diagram illustrating a contact surface of a vibration unit of a speaker according to an embodiment of the present disclosure.

FIG. 22 is a schematic diagram illustrating a contact surface of a vibration unit of a speaker according to some embodiments of the present disclosure. As shown in FIG. 22, FIG. 22 shows a plurality of exemplary structures of a contact surface. As used herein, 1704 is an example of a contact surface including a plurality of convex portions with a similar shape or a similar structure. The convex portion may be made of a material same as or similar to a material of other portions of a panel. Alternatively, the convex portion may be made of a material different from the material of other portions of the panel. Specifically, the convex portion may consist of a combination of a memory material and a material of a vibration-transfer layer. As used herein, a proportion of the memory material may be larger than or equal to 10%. Preferably, the proportion of the memory material in the convex portion may be larger than or equal to 50%. An area of a single convex portion may be 1% to 80% of a total area. Preferably, the area of the single convex portion may be 5% to 70% of the total area. More preferably, the area of the single convex portion may be 8% to 40% of the total area. A total area of all the convex portions may be 5% to 80% of the total area. Preferably, the total area of all the convex portions may be 10% to 60% of the total area. There may be at least one convex portion. Preferably, there may be one convex portion. More preferably, there may be two convex portions. Further preferably, there may be at least five convex portions. A shape of the convex portion may be circle, oval, triangle, rectangle, trapezoid, irregular polygon, or other similar shapes. As used herein, a structure of the convex portion may be symmetric or asymmetric. A location distribution of the convex portions may also be symmetric or asymmetric. The count of the convex portions may be one or multiple. Heights of the convex portions may be the same or different. The heights and distribution of the convex portions may be designed to form a certain gradient.

1705 is a structure of the convex portion of the contact surface, which is an example of a combination of more than two graphics. As used herein, the count of convex portions of different graphics may be one or more. The shapes of the two or more convex portions may be any two or a combination of a circle, an ellipse, a triangle, a rectangle, a trapezoid, an irregular polygon, or other similar shapes. The material, count, area, symmetry, etc. of the convex portions may be similar to those of 1704.

1706 is an example in which the convex portions of the contact surface are distributed on the edge of and inside the contact surface. As used herein, the count of the convex portions may not be limited to that shown in the figure. A ratio of the count of convex portions located on the edge of the contact surface to the count of all the convex portions may be 1%-80%. Preferably, the ratio may be 5%-70%. More preferably, the ratio may be 10%-50%. Further preferably, the ratio may be 30%-40%. The material, count, area, shape, symmetry, etc. of the convex portion may be similar to those of 1704.

1707 is a structural graphic of the concave portion of the contact surface. The structure of the concave portion may be symmetric or asymmetric. The position distribution of the concave portion may also be symmetric or asymmetric. The count of the concave portions may be one or more. The shapes of the concave portions may be the same or different. The concave portion may be hollow. A ratio of an area of one single concave to the total area of the contact surface may be 1%-80%. Preferably, the ratio may be 5%-70%. More preferably, the ratio may be 8%-40%. A ratio of a total area of all concave portions to the total area of the contact surface may be 5%-80%. Preferably, the ratio may be 10%-60%. There may be at least one concave portion. Preferably, there may be one concave portion. More preferably, there may be two concave portions. Further preferably, there may be at least five concave portions. The shape of the concave portion may be a circle, an ellipse, a triangle, a rectangle, a trapezoid, an irregular polygon, or other similar shapes.

1708 is an example in which there are both convex portions and concave portions on the contact surface. The count of the convex portions and concave portions is not limited to one or more. A ratio of the count of concave portion to the count of convex portions may be 0.1-100. Preferably, the ratio may be 1-80. More preferably, the ratio may be 5-60. Further preferably, the ratio may be 10-20. The material, area, shape, symmetry, etc. of a single convex portion/concave portion may be similar to those of 1704.

1709 is an example of a contact surface with a certain waviness. The waviness may be composed of two or more convex portions/concave portions or a combination of the convex portion and the concave portion. Preferably, distances between adjacent convex portions/concave portions may be equal. More preferably, the distances between the convex portions/concave portions may be equidistant arrangement.

1710 is an example in which there is a convex portion with a large area on the contact surface. A ratio of the area of the convex portion to the total area of the contact surface may be 30%-80%. Preferably, a part of the edge of the convex portion and a part of the edge of the contact surface may be substantially in contact with each other.

1711 is a first convex portion with a large area on the contact surface, and a second convex portion with a small area on the first convex portion. A ratio of the large area to the total area of the contact surface may be 30%-80%, and a ratio of the small area to the total area of the contact surface may be 1%-30%, preferably, the ratio of the small area to the total area of the contact surface may be 5%-20%. A ratio of the small area to the large area may be 5%-80%. Preferably, the ratio of the small area to the total area of the contact surface may be 10%-30%.

The above description of the structure of the contact surface of the speaker is only a specific example, and should not be regarded as the only feasible implementation solution. Obviously, for those skilled in the art, after understanding the basic principle of the sound quality of the speaker affected by the contact surface of the speaker, it may be possible to make various modifications and changes in the form and details of the specific method and operation of implementing the contact surface of the bone conduction speaker without departing from these principles, these modifications and changes are still within the scope described above. For example, the count of the convex portions or concave portions may not be limited to that shown in FIG. 22, and the above-described convex portions, concave portions, or contact surface graphic may also be modified to a certain extent, and these modifications are still within the protection scope described above Inside. Moreover, the contact surface of at least one or more vibrating units contained in the speaker may use the same or different shapes and materials mentioned above. The effect of vibrations transmitted on different contact surfaces may also vary with the properties of the contact surfaces. Finally, different sound quality effects may be obtained.

Figure 23:
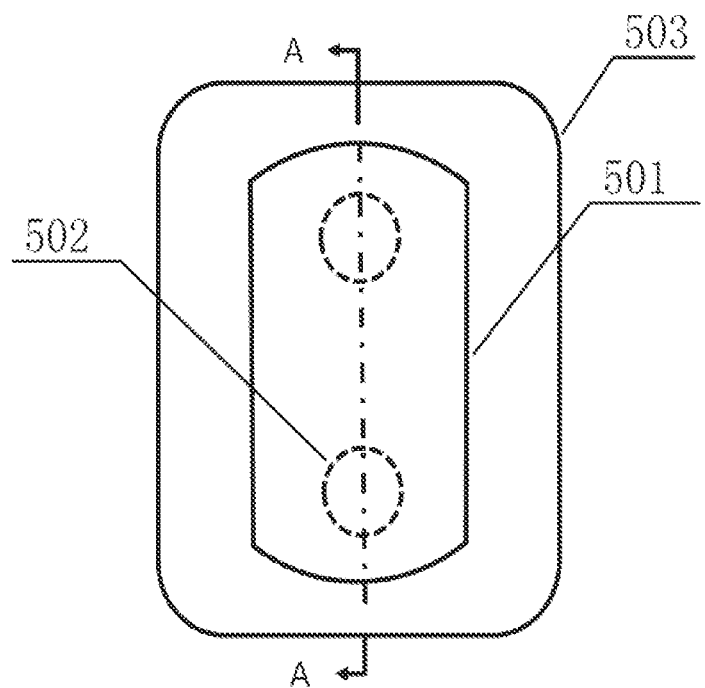
FIG. 23 is schematic diagram illustrating a vertical view of a bonding manner of a panel of a speaker according to some embodiments in the present disclosure.

In some embodiments, the side of the core housing fitted to the user may be composed of a panel and a vibration transmission layer. FIG. 23 is a front view and a side view of the panel and the vibration transmission layer connected to each other.

In some embodiments, the vibration transmission layer may be provided on an outer surface of a side wall of the core housing in contact with the human body. As used herein, the vibration transmission layer in this embodiment may be a specific embodiment to change physical characteristics of the contact surface of the vibration unit to change the sound transmission effect. Different regions on the vibration transmission layer may have different vibration transmission effects. For example, there may be a first contact surface region and a second contact surface region on the vibration transmission layer. Preferably, the first contact surface region may not be attached to the panel, and the second contact surface region may be attached to the panel. More preferably, when the vibration transmission layer is in direct or indirect contact with a user, a clamping force on the first contact surface region may be less than a clamping force on the second contact surface region (the clamping force herein refers to a pressure between the contact surface of the vibration unit and a user). Further preferably, the first contact surface region may not directly contact the user, and the second contact surface region may directly contact the user and transmit vibrations. An area of the first contact surface region may be different from an area of the second contact surface region. Preferably, the area of the first contact surface region may be smaller than the area of the second contact surface region. More preferably, there may be holes on the first contact surface region to further reduce the area of the first contact surface region. The outer surface (i.e., the surface facing the user) of the vibration transmission layer may be flat or uneven. Preferably, the first contact surface region may be on a plane different from the second contact surface region. More preferably, the second contact surface region may be higher than the first contact surface region. Further preferably, the second contact surface region and the first contact surface region may form a step structure. More preferably, the first contact surface region may be in contact with the user, and the second contact surface region may not be in contact with the user. Materials of the first contact surface region and the second contact surface region may be the same or different. The material may be one or more combinations of the vibration transmission layer materials described above. The above description of the clamping force on the contact surface is only a manifestation of the present disclosure. Those skilled in the art may modify the structure and manner described above according to actual requirements, and these modifications are still within the protection scope of the present disclosure. For example, the vibration transmission layer may be unnecessary. The panel may directly contact the user. Different contact surface regions may be provided on the panel. The different contact surface regions may have a same property as the first contact surface region and second contact surface region described above. As another example, a third contact surface region may be provided on the contact surface. The third contact surface region may have structure different from the first contact surface region and the second contact surface region, and these structures may obtain certain effects on reducing housing vibrations, suppressing sound leakage, improving the frequency response curve of the vibration unit, etc.

Figure 24:
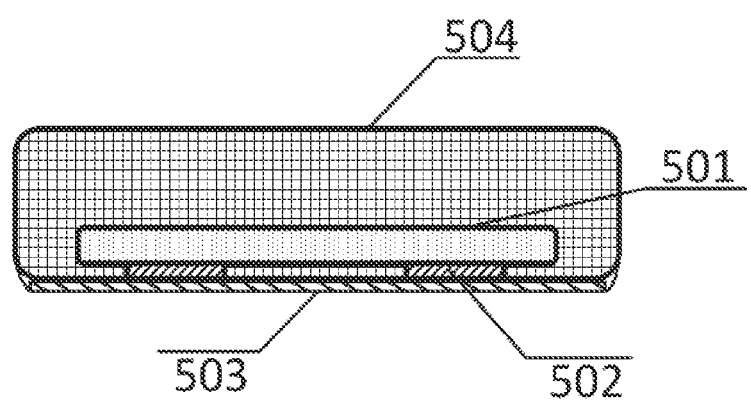
FIG. 24 is schematic diagram illustrating a vertical view of a bonding manner of a panel of a speaker according to some embodiments in the present disclosure.

As shown in FIG. 23 and FIG. 24, in some embodiments, a panel 501 and a vibration transmission layer 503 may be bonded by glue 502. Bonded portions may be located at both ends of the panel 501. The panel 501 may be located in a housing formed by the vibration transmission layer 503 and the housing 504. Preferably, a projection of the panel 501 on the vibration transmission layer 503 may be the first contact surface region, and a region around the first contact surface region may be the second contact surface region.

Figure 25:
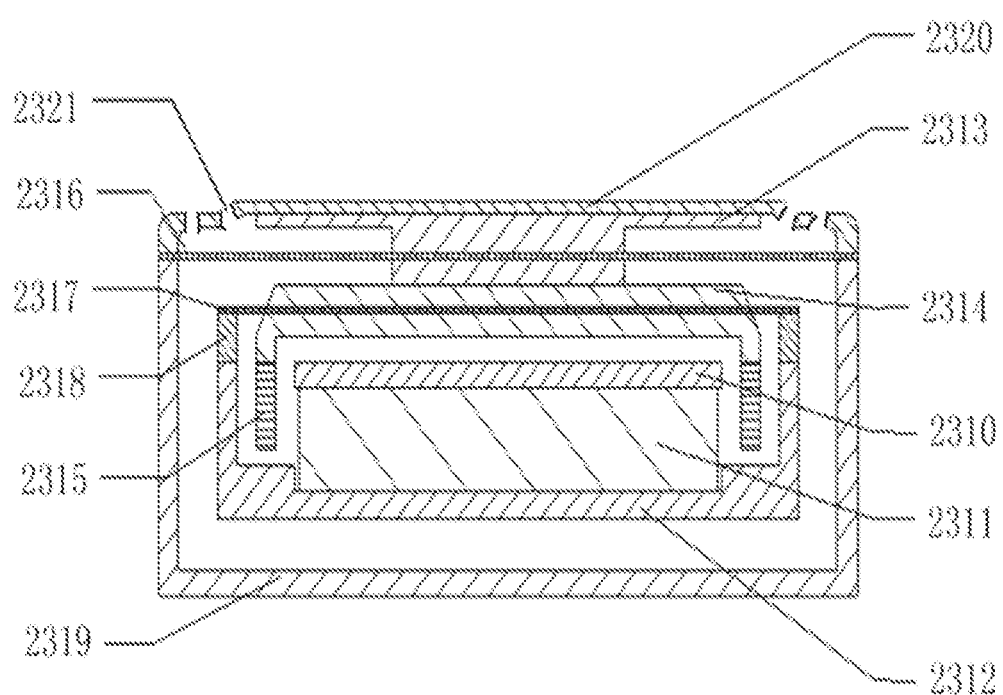
FIG. 25 is a structural diagram illustrating a vibration generating portion of a speaker according to some embodiments of the present disclosure.

In a specific embodiment, as shown in FIG. 25, a transducing device may include a magnetic circuit system including a magnetic conduction plate 2310, a magnet 2311, and a magnetizer 2312, a vibration plate 2314, a coil 2315, a first vibration transmission plate 2316, a second vibration transmission plate 2317, and a gasket 2318. A panel 2313 may protrude from a housing 2319, and be bonded to the vibration plate 2314 by glue. The first vibration transmission plate 2316 may connect and fix the transducing device on the housing 2319 to form a suspension structure. A vibration transmission layer 2320 (such as but not limited to silica gel) may be added on the panel 2313. The vibration transmission layer 2320 may produce a certain deformation to adapt to the shape of the skin. A portion of the vibration transmission layer 2320 that is in contact with the panel 2313 may be higher than a portion of the vibration transmission layer 2320 that is not in contact with the panel 2313, thereby forming a step structure. One or more small holes 2321 may be disposed in the portion of the vibration transmission layer 2320 that is not in contact with the panel 2313 (the part where the vibration transmission layer 2320 does not protrude in FIG. 25). The small holes in the vibration transmission layer may reduce sound leakage. That is, a connection between the panel 2313 and the housing 2319 through the vibration transmission layer 2320 may be weakened, and the vibration of the panel 2313 transmitted to the housing 2319 through the vibration transmission layer 2320 may be reduced, thereby reducing the sound leakage caused by the vibration of the housing 2319. An area of the non-protruding portion of the vibration transmission layer 2320 may be reduced after the small hole 2321 is provided, air that can be driven may be reduced, and the sound leakage caused by air vibration may be reduced. After the small holes 2321 are provided in the non-protruding portion of the vibration transmission layer 2320, the air vibration in the housing may be guided out of the housing, and the air vibration in the housing and the air vibration caused by the housing 2319 may be mutually offset to reduce the sound leakage. It should be noted that because the small holes 2321 may guide sound waves in the housing of the composite vibration device out to superimpose the leakage sound wave and further reduce the sound leakage, the small hole may also be called a sound guiding hole.

It should be noted herein that, in this embodiment, since the panel protrudes from the housing of the speaker, and the panel and the housing of the speaker is connected using the first vibration plate, a degree of coupling between the panel and the housing may be greatly reduced, and the first vibration transmission plate may provide a certain deformation, so that the panel may have a higher degree of freedom when the panel is fitted to the user, which may better adapt to a complex bonding surface. The first vibration transmission plate may make the panel produce a certain angle of inclination relative to the housing. Preferably, the inclination angle may be less than or equal to 5 degrees.

Figure 26:
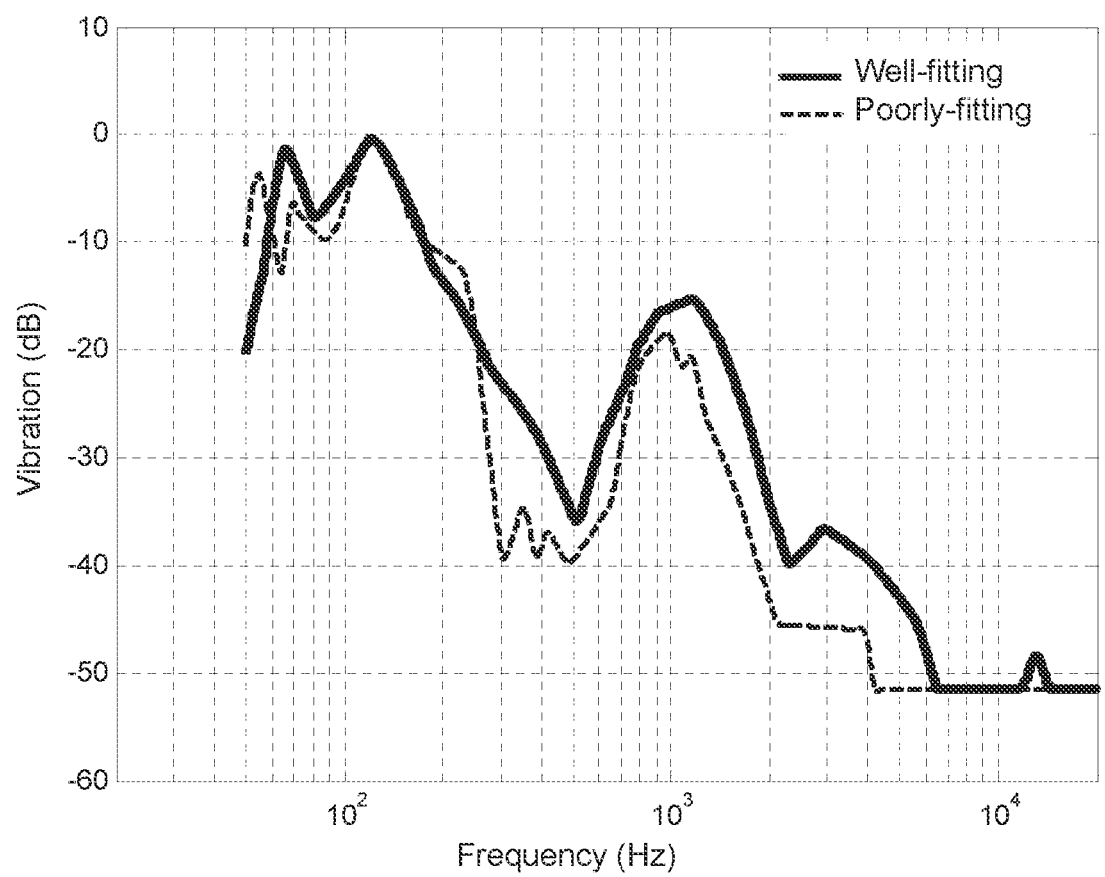
FIG. 26 is a schematic diagram illustrating a vibration response curve of a vibration generating portion of a speaker according to some embodiments of the present disclosure.

Further, a vibration efficiency of the speaker may vary with a fitting state. A speaker with a better fitting state may have a higher vibration transmission efficiency. As shown in FIG. 26, the thick line shows a vibration transmission efficiency in a better fitting state, and the thin line shows a vibration transmission efficiency in a poorly-fitting state. It may be seen that the vibration transmission efficiency in a well-fitting state is higher.

Figure 27:
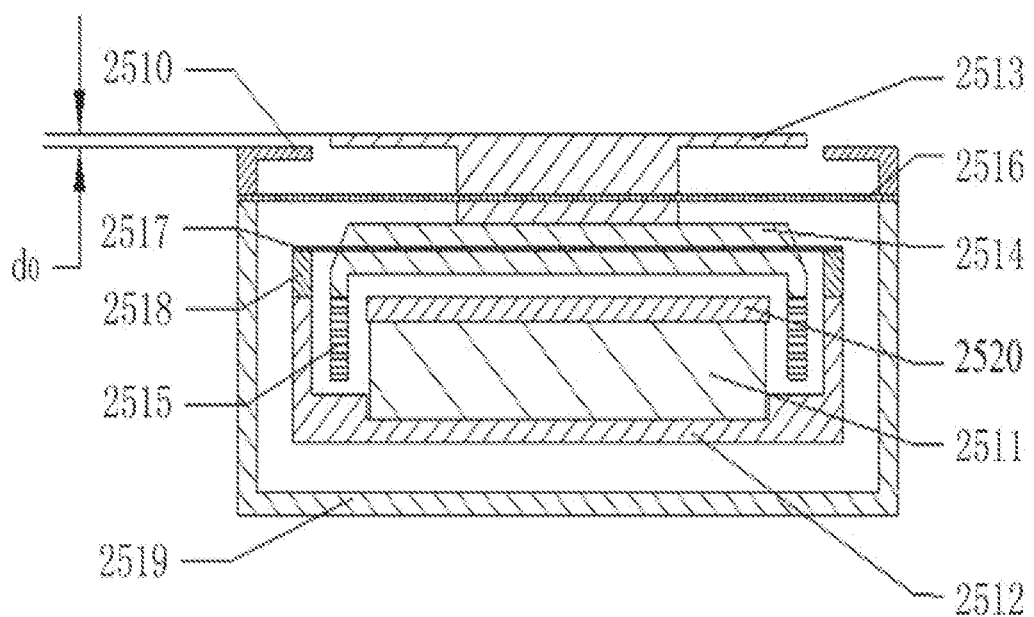
FIG. 27 is a structural diagram illustrating a vibration generating portion of a speaker according to some embodiments of the present disclosure.

FIG. 27 is a structural diagram illustrating a vibration generating portion of a speaker according to some embodiments of the present disclosure. As shown in FIG. 27, as a specific embodiment, in this embodiment, a transducing device may include a magnetic circuit system constituted by a magnetic conduction plate 2520, a magnet 2511, and a magnetizer 2512, a vibration plate 2514, a coil 2515, a first vibration transmission plate 2516, a second vibration transmission plate 2517, and a gasket 2518. A panel 2513 may protrude from a housing 2519, and be bonded to the vibration plate 2514 by glue. The first vibration transmission plate 2516 may connect and fix the transducing device on the housing 2519 to form a suspension structure.

A difference between this embodiment and the above-mentioned embodiment in FIG. 25 is that a border is added to the edge of the housing. In a contact between the housing and the skin, the border may make the force distribution more even and increase wearing comfort of the speaker. There may be a height difference do between the border 2510 and the panel 2513. The force of the skin acting on the panel 2513 may reduce a distanced between the panel 2513 and the border 2510. When a pressure between the speaker and a user is greater than a force experienced when the first vibration transmission plate 2516 is deformed into d0, the excess clamping force may be transmitted to the skin through the border 2510 without affecting the clamping force of the vibrating portion, thereby making the clamping force more consistent and ensuring sound quality.

In typical cases, the sound quality of the speaker may be affected by various factors such as the physical properties of components of the speaker, vibration transmission relationship(s) between the components, a vibration transmission relationship between the speaker and the outside, and the efficiency of a vibration transmission system when vibration is transmitted. The components of the speaker may include a component that generates the vibration (e.g., but is not limited to a transducing device), a component that fixes the speaker (e.g., but is not limited to a glasses rim), and a component that transmits the vibration (e.g., but is not limited to a panel, a vibration transmission layer, etc.). The vibration transmission relationship(s) between the components and the vibration transmission relationship between the speaker and the outside may be determined by a contact mode (e.g., but is not limited to, a damping force, a contact area, a contact shape, etc.) between the speaker and the user.

It should be noted that the above description of the step structure of the speaker on the glasses is only a specific example, and should not be regarded as the only feasible implementation. Obviously, for those skilled in the art, after understanding the basic principle of the step structure of the speaker on the glasses, it may be possible to make various modifications and changes in the form and details of the specific method and operation of implementing the step structure of the speaker on the glasses without departing from these principles, these modifications and changes are still within the scope described above. For example, the vibration transmission layer may not be limited to one layer, but may also include a plurality of layers. The specific count of layers may be determined according to actual conditions. In this application, the specific count of vibration transmission layers is not specifically limited herein. As another example, a count of step structures formed between the vibration transmission layer and the panel may not be limited to one in FIG. 27. When there are a plurality of vibration transmission layers, the step structures may be formed between each vibration transmission layer and the panel and between the vibration transmission layers. Such deformations are all within the protection scope of this application.

In some embodiments, the speaker of the glasses may be a standalone earphone that can be used directly, or an earphone plugged into an electronic device for use. In an application scenario, the bone conduction earphone in this embodiment is one of the speakers in the above implementation of glasses.

For illustration purposes only, an audio earphone core may be further described below based on the bone conduction earphone. It should be noted that the content described below may also be applied to an air conduction speaker without departing from these principles.

Figure 28:
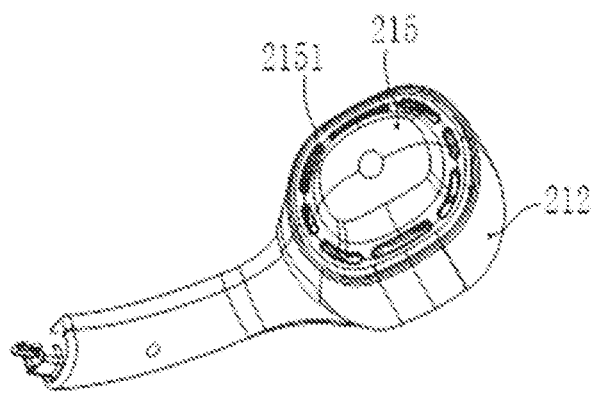
FIG. 28 is a structural diagram illustrating an earphone according to some embodiments of the present disclosure.
Figure 29:
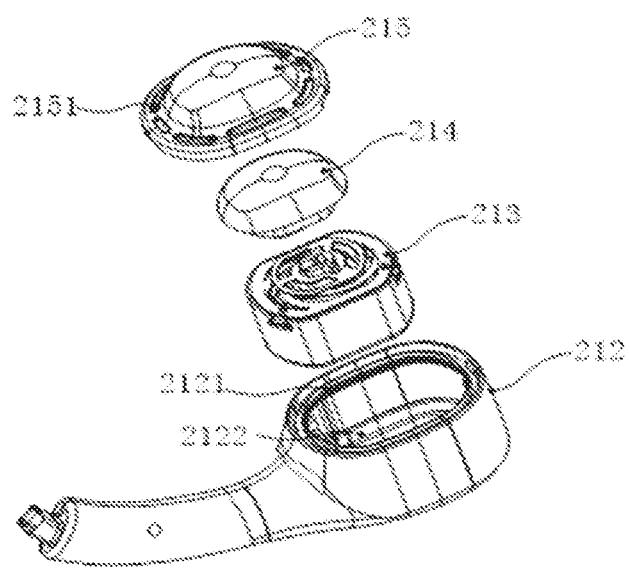
FIG. 29 is an exploded diagram illustrating an earphone according to some embodiments of the present disclosure.
Figure 30:
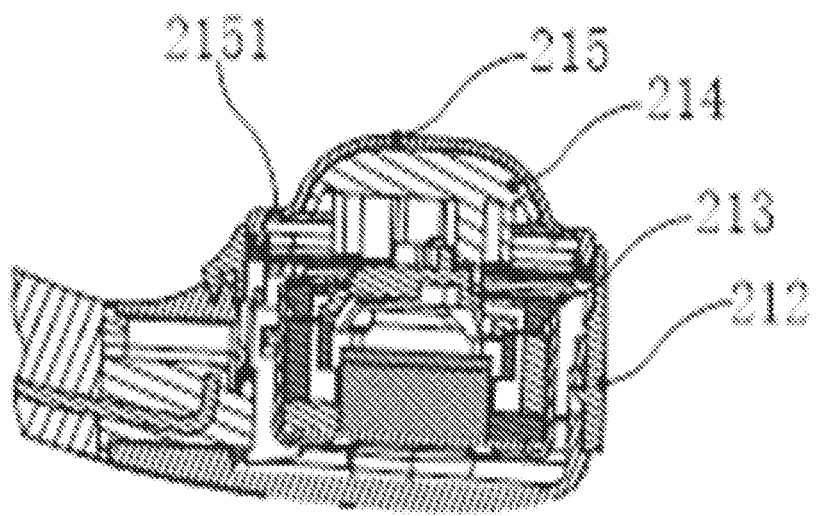
FIG. 30 is a sectional view along a symmetry plane of the earphone in FIG. 28.

In some embodiments, FIG. 28 is a schematic structural diagram illustrating an earphone according to an embodiment of the disclosure. FIG. 29 is an exploded structural diagram illustrating an earphone according to an embodiment of the disclosure. FIG. 30 is a sectional view along a symmetry plane of the earphone in FIG. 28. In this embodiment, the speaker may include an earphone housing 212, a transducing device 213, a vibration transmission plate 214, and a vibration transmission layer 215. The earphone housing 212 and the vibration transmission layer 215 herein may be equivalent to the vibration transmission layer 2320 in FIG. 25 of this application. In some embodiments, the transducing device 213 may include a vibration component and a magnetic circuit component.

As used herein, the earphone housing 212 may be configured to define an earphone accommodating chamber 2122 with an opening 2121, which may be used to accommodate related functional structures of an earphone. For example, the transducing device 213 may be accommodated in the earphone accommodating chamber 2122.

Specifically, the transducing device 213 may be configured to generate vibrations according to audio signals. As used herein, the audio signal may be an audio signal directly stored in the transducing device 213, or an audio signal input to the transducing device 213 from a storage device or a communication circuit through a signal line or the like, which is not limited herein.

Further, the vibration transmission plate 214 may be connected to the transducing device 213, and exposed through the opening 2121 of the earphone accommodating chamber 2122 to transmit the vibration. Specifically, the transducing device 213 may convert the audio signal into a corresponding vibration signal, and further transmit the vibration signal through the vibration transmission plate 214 to transmit the vibration signal from the accommodating chamber 2122 of the earphone housing 212 to an outside of the earphone housing 212. The vibration signal may be further transmitted to users who directly or indirectly contact the vibration transmission plate 214.

In addition, the vibration transmission layer 215 may be coated on an outer surface of the vibration transmission plate 214, so that the vibration signal generated by the transducing device 213 may be transmitted to a transmission layer of the vibration transmission plate 214 through the vibration transmission plate 214, and then the vibration signal may be transmitted to the user by contacting a specific part of the user. In this embodiment, the vibration transmission layer 215 may be further connected to the earphone housing 212 to cover the opening 2121 of the earphone accommodating chamber 2122, thereby protecting elements in the accommodating chamber 2122 of the earphone housing 212. Specifically, the vibration transmission layer 215 may be connected to the earphone housing 212 by means of insertion, buckling, bonding, etc. For example, the vibration transmission layer 215 may be buckled on a periphery of the earphone housing 212 by buckling.

In an application scenario, the vibration transmission plate 214 may be made of a hard material, such as hard plastic, to better transmit the vibration signal. The vibration transmission layer 215 may be made of a soft material, such as soft silica gel, to coat the outer surface of the vibration transmission plate 214. Therefore, the bone conduction earphone may further transmit the vibration signal to the user through the vibration transmission layer 215, so that the user may have a better tactile feeling when using the bone conduction earphone.

It should be noted that the vibration transmission layer 215 in this embodiment is coated on the outer surface of the vibration transmission plate 214 by an integral injection molding manner. Therefore, the vibration transmission layer 215 and the vibration transmission plate 214 may be integrated. Further, when assembling the earphone, there is no need to further glue the vibration transmission layer 215 and the vibration transmission plate 214 together by means such as glue, thereby simplifying assembly operations of the earphone. At the same time, the vibration transmission plate 214 and the vibration transmission layer 215 may be integrated, which may avoid an adverse effect of an uneven thickness of a glue layer between the vibration transmission plate 214 and the vibration transmission layer 215 caused by glue dispensing on the vibration transmission effect. Therefore, the transmission effect of vibration may be improved, and the sound transmission quality of the bone conduction earphone may be improved.

As used herein, in one embodiment, the vibration transmission plate 214 may protrude from the opening 2121 to transmit the vibration signal generated by the transducing device 213 in the accommodation chamber 2122 of the earphone housing 212 to the outside of the accommodation chamber 2122. Then the vibration signal may be transmitted to the user through the vibration transmission layer 215.

The vibration transmission layer 215 and a portion of the outer surface of the vibration transmission plate 214 exposed through the opening 2121 may be fully fitted to each other and integrally molded. Specifically, in an application scenario, the portion of the outer surface of the vibration transmission plate 214 exposed through the opening 2121 may be a curved surface protruding away from the accommodating chamber 2122. Correspondingly, the vibration transmission layer 215 may be fully fitted to the vibration transmission plate 214 and integrated by the injection molding manner through the curved surface. It should be noted that, if the vibration transmission plate 214 and the vibration transmission layer 215 are fully fitted by dispensing glue, first of all, as mentioned above, it is difficult to control uniformity of the formed glue layer due to the influence of air and dispensing technology, thereby reducing the vibration transmission effect. Secondly, if the full fit is performed by dispensing, the dispensing glue is likely to overflow in order to achieve the full fit. On one hand, the uniformity of the glue layer may be further reduced, and on the other hand, it also brings inconvenience to the assembly of the earphone. In this embodiment, the vibration transmission plate 214 and the vibration transmission layer 215 may be fully fitted by the integral injection molding manner, so as to avoid the adverse effects of the full fitting achieved by the above-mentioned dispensing. In addition, on one hand, an area where the vibration transmission layer 215 and the vibration transmission plate 214 are fitted may be increased, thereby improving the vibration transmission effect. On the other hand, the curved surface may also increase the contact area between the vibration transmission layer 215 and user's skin, thereby further improving the transmission effect of the vibration. Specifically, the portion of the outer surface of the vibration transmission plate 214 exposed through the opening 2121 may be a flat surface in a middle part and a curved surface at the peripheral part.

As used herein, in one embodiment, the vibration transmission plate 214 may be spaced apart from the earphone housing 212 at the opening 2121 to form an annular spaced region around the vibration transmission plate 214. A through hole 2151 may be disposed on a corresponding region of the vibration transmission layer 215 in the annular spaced region.

In this embodiment, the vibration transmission plate 214 may not be connected to the earphone housing 212. Specifically, an inner side of the earphone housing 212 and an outer side of the vibration transmission plate 214 at the opening 2121 may be both circular or similar to circular. Therefore, the earphone housing 212 and the vibration transmission plate 214 may jointly form an annular spaced region.

The vibration transmission layer 215 may be coated and disposed on the outer surface of the vibration transmission plate 214, and connected to the earphone housing 212 to cover the opening 2121 of the accommodating chamber 2122. Therefore, a direction away from the accommodating chamber 2122 of the annular spaced region may be covered by the vibration transmission layer 215.

In this embodiment, the through hole 2151 may be further disposed in the region of the vibration transmission layer 215 corresponding to the annular spaced region. Specifically, a shape of the through hole 2151 may be a circle, an ellipse, etc. The count of the through hole 2151 may be one or more, which is not limited herein. When a plurality of through holes 2151 are disposed, the through holes 2151 may be disposed apart from each other around the vibration transmission plate 214.

It should be noted that, in this embodiment, the through hole 2151 may connect the accommodating chamber 2122 with the outside of the earphone housing 212, thereby further reducing sound leakage through vibration cancellation. Therefore, the sound transmission effect of the bone conduction earphone may be further improved.

It should be noted that the above description of the structure of the earphone core on the glasses is only a specific example and should not be regarded as the only feasible implementation. Obviously, for those skilled in the art, after understanding the basic principle of the structure of the earphone core on the glasses, it may be possible to make various modifications and changes in the form and details of the specific method and operation of implementing the structure of the earphone core on the glasses without departing from these principles, these modifications and changes are still within the scope described above. For example, the shape of the vibration transmission plate 214 may be oval. Such deformations are all within the protection scope of this application.

Figure 31:
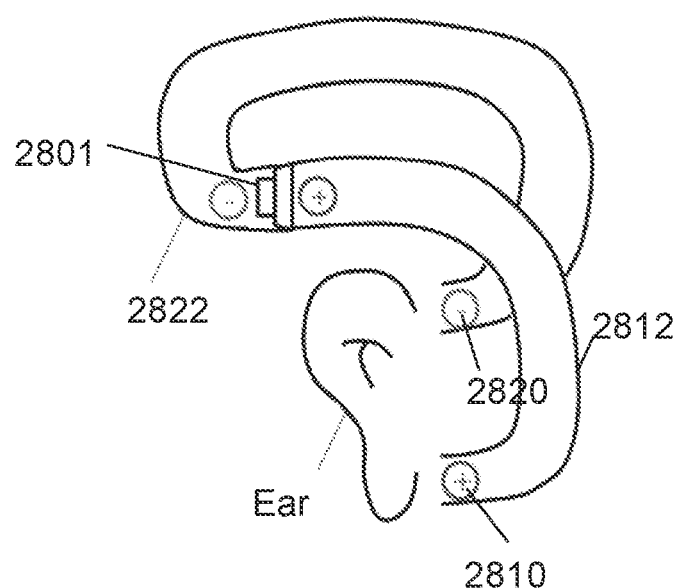
FIG. 31 is a schematic diagram illustrating transmitting sound through air conduction according to some embodiments of the present disclosure.

In some embodiments, the speaker described above may also transmit the sound to the user through air conduction. When the air condition is used to transmit the sound, the speaker may include one or more sound sources. The sound source may be located at a specific position of the user's head, for example, the top of the head, a forehead, a cheek, a temple, an auricle, the back of an auricle, etc., without blocking or covering an ear canal. FIG. 31 is a schematic diagram illustrating transmitting sound through air conduction according to some embodiments of the present disclosure.

As shown in FIG. 31, a sound source 2810 and a sound source 2820 may generate sound waves with opposite phases ("+" and "−" in the figure may indicate the opposite phases). For brevity, the sound sources mentioned herein may refer to sound outlets of the speaker that may output sounds. For example, the sound source 2810 and the sound source 2820 may be two sound outlets respectively located at specific positions of the speaker (e.g., the core housing 108, or the glasses temple 15).

In some embodiments, the sound source 2810 and the sound source 2820 may be generated by the same vibration device 2801. The vibration device 2801 may include a diaphragm (not shown in the figure). When the diaphragm is driven to vibrate by an electric signal, the front side of the diaphragm may drive air to vibrate. The sound source 2810 may form at the sound output through a sound guiding channel 2812. The back of the diaphragm may drive air to vibrate, and the sound source 2820 may be formed at the sound output hole through a sound guiding channel 2822. The sound guiding channel may refer to a sound transmission route from the diaphragm to the corresponding outlet. In some embodiments, the sound guiding channel may be a route surrounded by a specific structure (e.g., the core housing 212 in FIG. 28, or the glasses temple 15 in FIG. 7) on the speaker. It should to be known that in some alternative embodiments, the sound source 2810 and the sound source 2820 may also be generated by different vibrating diaphragms of different vibration devices, respectively.

Among the sounds generated by the sound source 2810 and the sound source 2820, one portion may be transmitted to the ear of the user to form the sound heard by the user. Another portion may be transmitted to the environment to form a leaked sound. Considering that the sound source 2810 and the sound source 2820 are relatively dose to the ears of the user, for convenience of description, the sound transmitted to the ears of the user may be referred to as a near-field sound. The leaked sound transmitted to the environment may be referred to as a far-field sound. In some embodiments, the near-field/far-field sounds of different frequencies generated by the speaker may be related to a distance between the sound source 2810 and the sound source 2820. Generally speaking, the near-field sound generated by the speaker may increase as the distance between the two sound sources increases, while the generated far-field sound (the leaked sound) may increase with increasing the frequency.

For the sounds of different frequencies, the distance between the sound source 2810 and the sound source 2820 may be designed, respectively, so that a low-frequency near-field sound (e.g., a sound with a frequency of less than 800 Hz) generated by the speaker may be as large as possible and a high-frequency far-field sound (e.g., a sound with a frequency greater than 2000 Hz) may be as small as possible. In order to implement the above purpose, the speaker may include two or more sets of dual sound sources. Each set of the dual sound sources may include two sound sources similar to the sound source 2810 and the sound source 2820, and generate sounds with specific frequencies, respectively. Specifically, a first set of the dual sound sources may be used to generate low frequency sounds. A second set of the dual sound sources may be used to generate high frequency sounds. In order to obtain more low-frequency near-field sounds, the distance between two sound sources in the first set of the dual sound sources may be set to a larger value. Since the low-frequency signal has a longer wavelength, the larger distance between the two sound sources may not cause a large phase difference in the far-field, and not form excessive leaked sound in the far-field. In order to make the high-frequency far-field sound smaller, the distance between the two sound sources in the second set of the dual sound sources may be set to a smaller value. Since the high-frequency signal has a shorter wavelength, the smaller distance between the two sound sources may avoid the generation of the large phase difference in the far-field, and thus the generation of the excessive leaked sounds may be avoided. The distance between the second set of the dual sound sources may be less than the distance between the first set of the dual sound sources.

The beneficial effects of the embodiments of the present disclosure may include but be not limited to the following. (1) Through the rotating shaft, the glasses rim and glasses temple may be connected, thereby protecting the connection wire in the glasses, and extending the life of the connection wire. (2) The flexible circuit board may simplify the wiring manner in the speaker. (3) The structure and shape of the vibration unit may be changed through the gradient structure to change the sound transmission effect, thereby changing the sound quality of the bone conduction speaker. (4) A higher fitting effect with the user may be achieved through the step structure. (5) The sound transmission effect of the speaker may be further improved through the earphone core. It should be noted that different embodiments may produce different beneficial effects. In different embodiments, the possible beneficial effects may be any one or a combination of the above, or any other beneficial effects that may be obtained.

The above are only implementations of this application, and do not limit the scope of this application. Any equivalent structure or equivalent process transformation made by using the description and drawings of this application, or directly or indirectly applied to other related technical fields, may be included in the scope of patent protection of this application.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

What is claimed is:

1. A glasses, comprising:
   a glasses rim;
   a glasses temple, the glasses temple accommodating a control circuit or a battery;
   a rotating shaft, the rotating shaft being configured to connect the glasses rim and the glasses temple, so that the glasses rim and the glasses temple are able to relatively rotate around the rotating shaft, and the rotating shaft being disposed with a rotating shaft wiring channel along an axial direction, wherein
      the rotating shaft includes a first rotating shaft;
      two ends of the first rotating shaft are respectively connected to the glasses rim and the glasses temple;
      the rotating shaft wiring channel is disposed along an axial direction of the first rotating shaft;
      the rotating shaft wiring channel communicates with an outside through a wiring port disposed on at least one end surface of the first rotating shaft; and
      the connection wire extends to the glasses rim or the glasses temple through the wiring port;
   a connection wire, the connection wire passing through the rotating shaft wiring channel and extending to the glasses rim and the glasses temple, respectively; and
   a speaker, the speaker comprising an earphone core, the speaker being connected to the glasses temple, the control circuit or the battery in the glasses temple driving the earphone core to vibrate to generate a sound through the connection wire, and the speaker comprising at least one contact surface, the contact surface including a gradient structure causing a uneven distribution of pressure on the contact surface when in contact with a user.

2. The glasses of claim 1, wherein
   the rotating shaft wiring channel communicates with the outside through a first wiring port and a second wiring port respectively disposed on two end surfaces of the first rotating shaft; and
   the connection wire extends to the glasses rim and the glasses temple through the first wiring port and the second wiring port, respectively.

3. The glasses of claim 1, wherein
   the rotating shaft wiring channel communicates with the outside through a first wiring port disposed on an end surface of the first rotating shaft and a second wiring port disposed on a side wall of the first rotating shaft; and
   the connection wire extends to the glasses rim and the glasses temple through the first wiring port and the second wiring port, respectively.

4. The glasses of claim 3, wherein the first rotating shaft is fixedly connected to one of the glasses rim and the glasses temple disposed near the second wiring port, and rotatably connected to another of the glasses rim and the glasses temple disposed near the first wiring port.

5. The glasses of claim 3, wherein the rotating shaft further comprises a second rotating shaft that is coaxial with and spaced from the first rotating shaft;
   the glasses rim includes a first lug, and the glasses temple includes a second lug and a third lug disposed at intervals;
   end portions of the first rotating shaft and the second rotating shaft close to each other are connected to the first lug, end portions of the first rotating shaft and the second rotating shaft away from each other are connected to the second lug and the third lug, respectively, so as to keep the first lug between the second lug and the third lug.

6. The glasses of claim 5, wherein
   the first wiring port is disposed on an end surface of the first rotating shaft close to the second rotating shaft;
   the second wiring port is disposed on a side wall of the first rotating shaft close to the second lug; and
   the first rotating shaft is rotatably connected to the first lug and fixedly connected to the second lug.

7. The glasses of claim 1, wherein the speaker further comprises:
   an auxiliary function module configured to receive an auxiliary signal and execute an auxiliary function;
   a flexible circuit board configured to electrically connect to an audio signal wire and an auxiliary signal wire of the control circuit, and electrically connect the audio signal wire and the auxiliary signal wire with the earphone core and the auxiliary function module via the flexible circuit board, respectively; and
   a core housing configured to accommodate the earphone core, the auxiliary function module, and the flexible circuit board.

8. The glasses of claim 7, wherein
   the flexible circuit board at least comprises a number of first pads and a number of second pads;
   at least one of the first pads is electrically connected to the audio signal wire, the at least one first pad is electrically connected to at least one of the second pads via a first flexible lead on the flexible circuit board, and the at least one second pad is electrically connected to the earphone core via an external wire; and at least another one of the first pads is electrically connected to the auxiliary signal wire, and the at least another one of the first pads is electrically connected to the auxiliary function module via a second flexible lead on the flexible circuit board.

9. The glasses of claim 8, wherein
the flexible circuit board at least includes a main circuit board and a first branch circuit board;
the first branch circuit board is connected to the main circuit board, away from the main circuit board, and extends along one end of the main circuit board; and
the auxiliary function module includes at least a first auxiliary function module and a second auxiliary function module;
the first auxiliary function module is disposed on the main circuit board; and
the second auxiliary function module is disposed on the first branch circuit board.

10. The glasses of claim 9, wherein
the flexible circuit board further includes a second branch circuit board,
the second branch circuit board is connected to the main circuit board, away from the main circuit board, extends along the other end of the main circuit board, and is spaced apart from the first branch circuit board; and
the auxiliary function module further includes a third auxiliary function module, and the third auxiliary function module is disposed on the second branch circuit board.

11. The glasses of claim 8, wherein the earphone core includes:
a magnetic circuit component configured to provide a magnetic field;
a vibration component, the vibration component comprising a coil and an inner lead, wherein
the coil is located in the magnetic field,
the inner lead is electrically connected to the coil,
the coil receives an audio current via the inner lead and converts the audio current into a mechanical vibration signal under an action of the magnetic field,
one end of the external wire transmitting the audio current to the coil is electrically connected to the second pad, and
the other end of the external wire is electrically connected to the inner lead.

12. The glasses of claim 11, wherein
the vibration component is disposed inside an accommodation chamber with an opening formed by the core housing, and is capable of generating a vibration based on an audio signal; and
the earphone core further includes
a vibration transmission plate connected to a transducing device and exposed through the opening to transmit the vibration; and
a vibration transmission layer covering an outer surface of the vibration transmission plate in an integral injection molding manner, and further being connected to the core housing to seal the opening.

13. The glasses of claim 12, wherein
the vibration transmission plate protrudes from the opening, and
the vibration transmission layer is fitted with the outer surface of the vibration transmission plate in an integral injection molding manner.

14. The glasses of claim 12, wherein
the vibration transmission plate is spaced apart from the core housing at the opening to form an annular spaced region around the vibration transmission plate, and
the vibration transmission layer is disposed with a through hole at a region corresponding to the annular spaced region.

15. The glasses of claim 14, wherein there are a plurality of through holes, the plurality of through holes being arranged around the vibration transmission plate at intervals.

16. The glasses of claim 12, wherein a material of the vibration transmission plate is hard rubber, and a material of the vibration transmission layer is soft rubber.

17. The glasses of claim 7, wherein the core housing further includes at least one contact surface, the contact surface being in direct or indirect contact with the user; and
the contact surface at least includes a first contact surface region and a second contact surface region, a protrusion degree of the second contact surface region being higher than a protrusion degree of the first contact surface region.

18. The glasses of claim 1, wherein the gradient structure includes at least one convex surface and at least one concave surface.

19. The glasses of claim 1, wherein the gradient structure is located at a center or an edge of the contact surface.

* * * * *